(12) United States Patent
Kim et al.

(10) Patent No.: US 7,791,078 B2
(45) Date of Patent: Sep. 7, 2010

(54) LIQUID CRYSTAL DISPLAY

(75) Inventors: Dong-Gyu Kim, Yongin-si (KR); Seung-Soo Baek, Seoul (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 281 days.

(21) Appl. No.: 11/733,404

(22) Filed: Apr. 10, 2007

(65) Prior Publication Data

US 2007/0235735 A1 Oct. 11, 2007

(30) Foreign Application Priority Data

Apr. 11, 2006 (KR) ...................... 10-2006-0032589

(51) Int. Cl.
*H01L 29/04* (2006.01)

(52) U.S. Cl. .................. 257/72; 257/59; 257/E27.111; 257/E27.131; 349/43

(58) Field of Classification Search .................. 257/72, 257/59; 349/43
See application file for complete search history.

(56) References Cited

U.S. PATENT DOCUMENTS

| | | | |
|---|---|---|---|
| 2004/0012554 A1* | 1/2004 | Song et al. .................... | 345/92 |
| 2006/0164352 A1* | 7/2006 | Yoo et al. ...................... | 345/87 |
| 2006/0208984 A1* | 9/2006 | Kim et al. ...................... | 345/90 |
| 2006/0215071 A1* | 9/2006 | Shin et al. ...................... | 349/44 |
| 2007/0008263 A1* | 1/2007 | Kim ............................. | 345/87 |
| 2007/0109238 A1* | 5/2007 | Lee et al. ...................... | 345/87 |
| 2007/0126944 A1* | 6/2007 | Kim et al. ..................... | 349/43 |

* cited by examiner

*Primary Examiner*—A. Sefer
(74) *Attorney, Agent, or Firm*—H.C. Park & Associates, PLC

(57) ABSTRACT

A liquid crystal display includes first pixels and second pixels, a plurality of gate lines to transmit gate signals, and a plurality of pairs of first and second data lines crossing the gate lines, the pairs of first data lines and second data lines facing each other with a pixel interposed there between. Each of the first pixels and the second pixels includes pixel electrode and each pixel electrode includes a first sub-pixel electrode and a second sub-pixel electrode. A first drain is electrode disposed on the right of the first data line, and a second drain electrode is disposed on the left of the second data line. The first drain electrode is connected to the first sub-pixel electrode while the second drain electrode is connected to the second sub-pixel electrode in the first pixels, and the first drain electrode is connected to the second sub-pixel electrode while the second drain electrode is connected to the first sub-pixel electrode in the second pixels. The first drain electrode of the first pixel has substantially the same shape as the second drain electrode of the second pixel, and the first drain electrode of the second pixel has substantially the same shape as the second drain electrode of the first pixel.

33 Claims, 16 Drawing Sheets

LIQUID CRYSTAL DISPLAY

CROSS-REFERENCE TO RELATED APPLICATION

This application claims priority to and the benefit of Korean Patent Application No. 10-2006-0032589, filed on Apr. 11, 2006, which is hereby incorporated by reference for all purposes as if fully set forth herein.

BACKGROUND OF THE INVENTION

1. Field of Invention

The present invention relates to a liquid crystal display.

2. Discussion of the Background

Liquid crystal displays (LCDs) are one of the most widely used flat panel displays. An LCD includes a pair of panels provided with field-generating electrodes, such as pixel electrodes and a common electrode, and a liquid crystal (LC) layer interposed between the two panels. An LCD displays images by applying voltages to the field-generating electrodes to generate an electric field in the LC layer that determines the orientations of LC molecules therein to adjust polarization of incident light.

An LCD also includes switching elements, which are connected to the respective pixel electrodes and a plurality of signal lines, such as gate lines and data lines, for controlling the switching elements and thereby applying voltages to the pixel electrodes.

Various methods for improving the motion picture display characteristics of LCDs have been attempted. For example, a high-speed drive method is under development. Since a high frame speed in the high-speed driving method has high power consumption, column inversion, which is an inversion driving method, may be employed to minimize the power consumption.

However, in the case of a column inversion drive, when a box that has a higher gray than the background screen is displayed in the center of a screen, vertical crosstalk may occur, in which the gray above and below the box is different from that of the background screen. Also, vertical flickering may occur when data voltages of the same polarity are applied vertically and there is a difference between data voltages of positive polarity and negative polarity.

The above information disclosed in this Background section is only for enhancement of understanding of the background of the invention and therefore it may contain information that does not form the prior art that is already known in this country to a person of ordinary skill in the art.

SUMMARY OF THE INVENTION

The present invention provides a liquid crystal display which may have minimal or no degradation of image quality when a column inversion drive is performed and may also have uniform optical characteristics for all pixels.

Additional features of the invention will be set forth in the description which follows, and in part will be apparent from the description, or may be learned by practice of the invention.

The present invention discloses a liquid crystal display including first pixels and second pixels, a plurality of gate lines to transmit gate signals, and a plurality of pairs of first data lines and second data lines crossing the gate lines. The pairs of first data lines and second data lines face each other with a pixel interposed there between. Each first pixel and each second pixel includes a pixel electrode including a first sub-pixel electrode and a second sub-pixel electrode, a first drain electrode disposed on the right of the first data line, and a second drain electrode disposed on the left of the second data line. The first drain electrode is connected to the first sub-pixel electrode while the second drain electrode is connected to the second sub-pixel electrode in the first pixel, and the first drain electrode is connected to the second sub-pixel electrode while the second drain electrode is connected to the first sub-pixel electrode in the second pixel. The first drain electrode of the first pixel has substantially the same shape as the second drain electrode of the second pixel, and the first drain electrode of the second pixel has substantially the same shape as the second drain electrode of the first pixel.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate embodiments of the invention, and together with the description serve to explain the principles of the invention.

DETAILED DESCRIPTION OF THE ILLUSTRATED EMBODIMENTS

Figure 1:
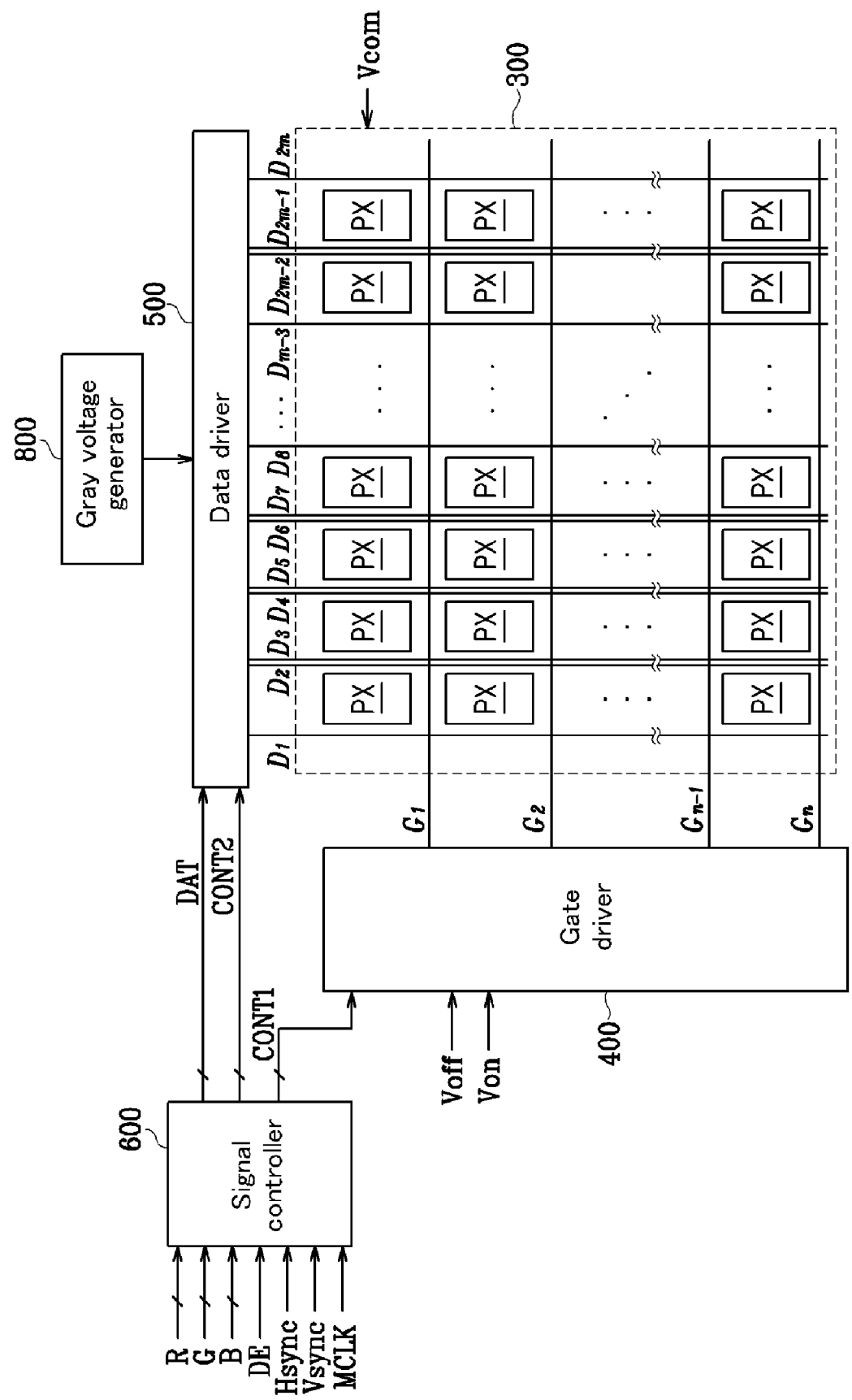
FIG. 1 is a block diagram of an LCD according to an exemplary embodiment of the present invention.

The invention is described more fully hereinafter with reference to the accompanying drawings, in which embodiments of the invention are shown. This invention may, however, be embodied in many different forms and should not be construed as limited to the embodiments set forth herein. Rather, these embodiments are provided so that this disclosure is thorough, and will fully convey the scope of the invention to those skilled in the art. In the drawings, the thickness of layers, films, panels, regions, etc., are exaggerated for clarity. Like reference numerals designate like elements throughout the specification.

It will be understood that when an element or layer is referred to as being "on" or "connected to" another element or layer, it can be directly on or directly connected to the other element or layer, or intervening elements or layers may be present. In contrast, when an element or layer is referred to as being "directly on" or "directly connected to" another element or layer, there are no intervening elements or layers present.

LCDs according to exemplary embodiments of the present invention will be described in detail with reference to the accompanying drawings.

Figure 2:
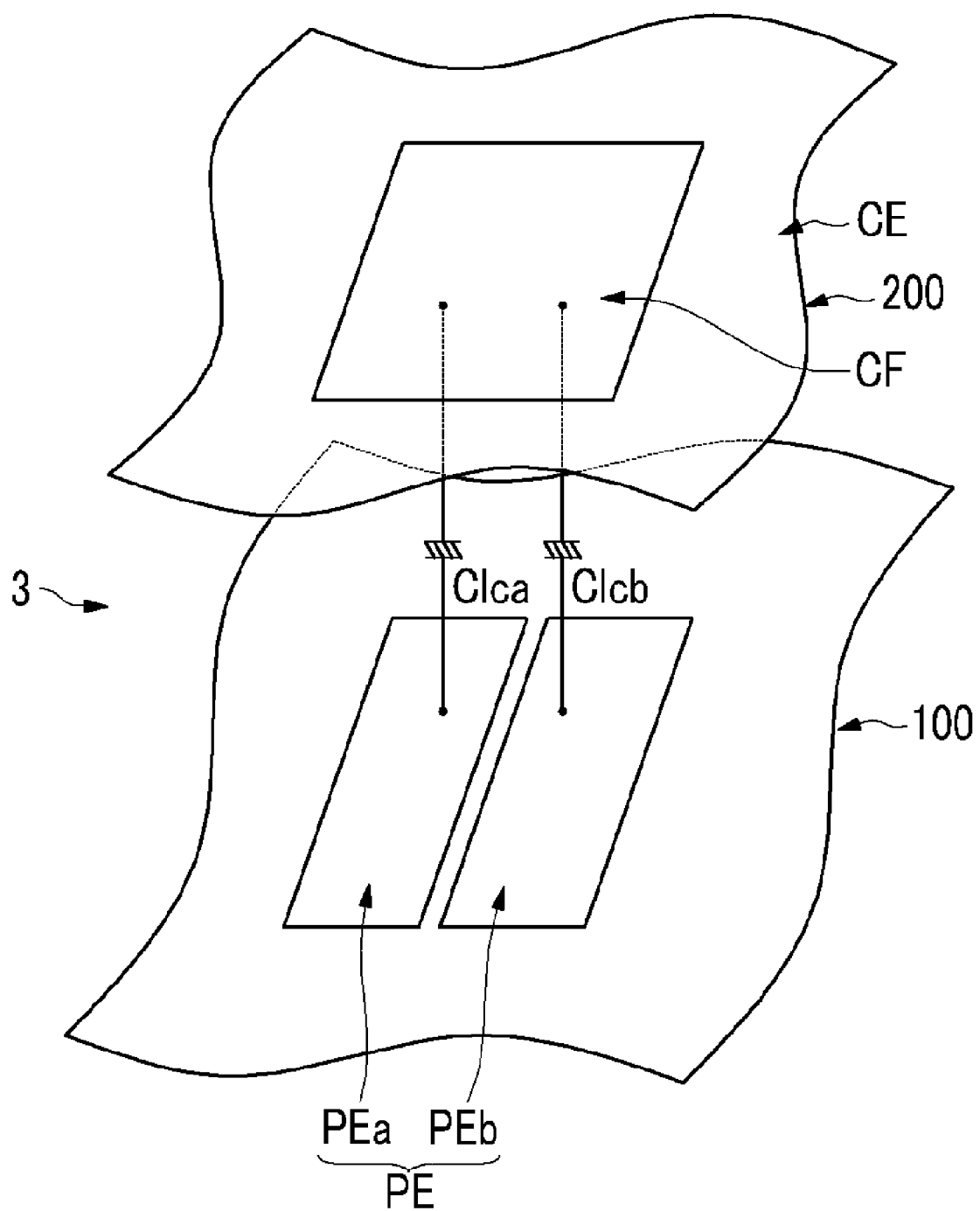
FIG. 2 is an equivalent circuit diagram of two sub-pixels of an LCD according to an exemplary embodiment of the present invention.
Figure 3:
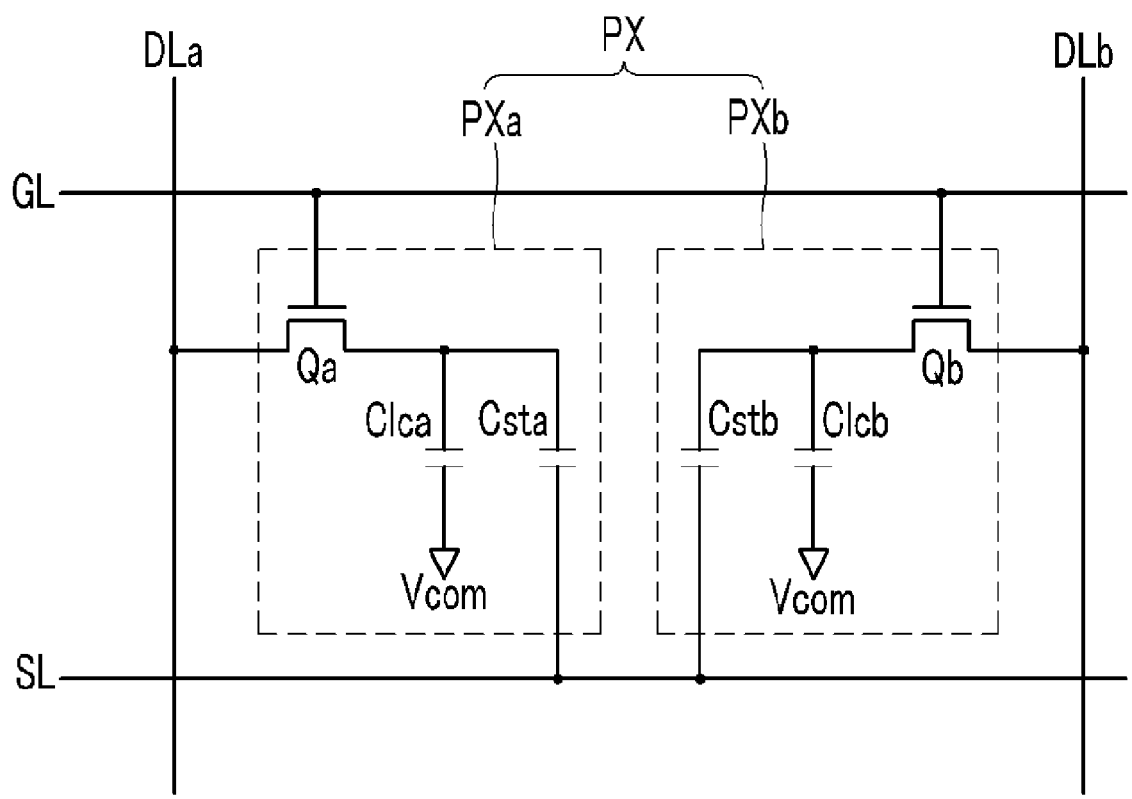
FIG. 3 is an equivalent circuit diagram of a pixel of an LC panel assembly according to an exemplary embodiment of the present invention.

FIG. 1 is a block diagram of an LCD according to an exemplary embodiment of the present invention, FIG. 2 is an equivalent circuit diagram of two sub-pixels of an LCD according to an exemplary embodiment of the present invention, and FIG. 3 is an equivalent circuit diagram of a pixel of an LC panel assembly according to an exemplary embodiment of the present invention.

As shown in FIG. 1, an LCD according to an exemplary embodiment of the present invention includes an LC panel assembly 300, a gate driver 400 and a data driver 500 connected to the LC panel assembly 300, a gray voltage generator 800 connected to the data driver 500, and a signal controller 600 for controlling the above elements.

The LC panel assembly 300 includes a plurality of signal lines $G_1$-$G_n$ and $D_1$-$D_{2m}$ and a plurality of pixels PX connected to the signal lines and arranged substantially in a matrix, as seen in the equivalent circuit diagram. The LC panel assembly 300 further includes a lower panel 100 and an upper panel 200 that face each other and a LC layer 3 interposed there between, as shown in FIG. 2.

The signal lines $G_1$-$G_n$ and $D_1$-$D_{2m}$ include a plurality of gate lines $G_1$-$G_n$ for transmitting gate signals (also referred to as "scanning signals") and a plurality of data lines $D_1$-$D_{2m}$ for transmitting data signals. The gate lines $G_1$-$G_n$ extend substantially in a row direction and are substantially parallel to each other, and the data lines $D_1$-$D_{2m}$ extend substantially in a column direction and are substantially parallel to each other. A pair of data lines $D_1$-$D_{2m}$ is disposed on each side of a pixel PX.

Each pixel PX includes a pair of sub-pixels PXa and PXb. Each sub-pixel PXa and PXb includes a switching element (not shown) connected to the signal lines $G_1$-$G_n$ and $D_1$-$D_{2m}$, and an LC capacitor Clca and Clcb and a storage capacitor (not shown) connected to the switching element. The storage capacitor may be omitted.

The switching element includes a thin film transistor and is a three-terminal element provided on the lower panel 100. The control terminal of the switching element is connected to the gate line $G_1$-$G_n$, the input terminal thereof is connected to the data line $D_1$-$D_{2m}$, and the output terminal thereof is connected to an LC capacitor Clca and Clcb and a storage capacitor .

As FIG. 2 shows, each LC capacitor Clca and Clcb includes a sub-pixel electrode PEa and PEb provided on the lower panel 100 and a common electrode CE provided on an upper panel 200 as two terminals. The LC layer 3 disposed between the sub-pixel electrode PEa and PEb and the common electrode CE functions as a dielectric of the LC capacitor Clca and Clcb. Each pair of sub-pixel electrodes PEa and PEb are separated from each other and form a pixel electrode PE. The common electrode CE is formed on the entire surface of the upper panel 200 and supplied with a common voltage Vcom. Unlike FIG. 2, the common electrode CE may be provided on the lower panel 100, and in this case, at least one of the two electrodes PE and CE may be bar-shaped. The LC layer 3 has negative dielectric anisotropy, and the LC molecules in the LC layer 3 may be aligned such that their major axes are substantially perpendicular to the two panels in the absence of an electric field.

The storage capacitor functioning as an auxiliary capacitor for the liquid crystal capacitor Clca and Clcb is formed by overlapping another signal line (not shown), which is supplied with a predetermined voltage, such as a common voltage Vcom, and provided on the lower panel 100, with a pixel electrode PE via an insulator disposed there between. Alternatively, the storage capacitor may be formed by overlapping a pixel electrode PE with the previous gate line immediately above it via an insulator.

In the meantime, in order to implement color display, each pixel PX may display one primary color (spatial division) or each pixel PX may sequentially display the primary colors in turn (temporal division) such that the spatial or temporal sum of the primary colors is recognized as a desired color. The primary colors may include red, green, and blue. FIG. 2 shows an example of spatial division in which each pixel PX includes a color filter CF representing one of the primary colors in an area of the upper panel 200 facing the pixel electrode PE. Unlike FIG. 2, the color filter CF may be provided on or under the sub-pixel electrode PE provided on the lower panel 100.

Polarizers (not shown) are provided on the outer surface of the panels 100 and 200, and the polarization axes of the two polarizers may be perpendicular to each other. One of the two polarizers may be omitted when the LCD is a reflective LCD. In the case of perpendicular polarizers, light incident to the LC layer 3 cannot pass through the polarizer in the absence of an electric field.

Referring to FIG. 1 again, the gray voltage generator 800 generates two sets of a plurality of gray voltages (or reference gray voltages) related to the transmittance of the pixels PX. However, the gray voltage generator 800 may generate only a given number of gray voltages (referred to as reference gray voltages) instead of generating all of the gray voltages. Gray voltages of one set have a positive value with respect to the common voltage Vcom, while gray voltages of the other set have a negative value with respect to the common voltage Vcom.

The gate driver 400 is connected to the gate lines $G_1$-$G_n$ of the LC panel assembly 300 and synthesizes a gate-on voltage Von and a gate-off voltage Voff to generate gate signals, which are applied to the gate lines $G_1$-$G_n$.

The data driver 500 is connected to the data lines $D_1$-$D_{2m}$ of the LC panel assembly 300 and selects the gray voltages supplied from the gray voltage generator 800 and then applies the selected gray voltage to the data lines $D_1$-$D_{2m}$ as a data signal.

The signal controller 600 controls the gate driver 400 and the data driver 500.

Each of the elements 400, 500, 600, and 800 may be directly mounted on the LC panel assembly 300 in the form of at least one integrated circuit (IC) chip, may be mounted on a flexible printed circuit film (not shown) in a tape carrier package (TCP) type that is attached to the LC panel assembly 300, or may be mounted on a separate printed circuit board (not shown). Alternatively, each of the elements 400, 500, 600, and 800 may be integrated with the LC panel assembly 300. Also, the elements 400, 500, 600, and 800 may be integrated into a single chip, and in this case, at least one thereof, or at least one circuit element forming those, may be located outside of the single chip.

Now, a structure of the LC panel assembly will be described in detail with reference to FIG. 3, FIG. 4, FIG. 5, FIG. 6, FIG. 7, FIG. 8, and FIG. 9 along with FIG. 1 and FIG. 2 described above.

FIG. 3 is an equivalent circuit diagram of a pixel of an LC panel assembly according to an exemplary embodiment of the present invention.

Referring to FIG. 3, an LCD panel assembly according to the present embodiment includes signal lines including a plurality of gate lines GL, a plurality of pairs of data lines DLa and DLb, and a plurality of storage electrode lines SL, and a plurality of pixels PX connected to the signal lines.

Each pixel PX includes a pair of sub-pixels PXa and PXb, and each sub-pixel PXa and PXb, respectively, includes a switching element Qa and Qb connected to the corresponding gate line GL and data line DLa and DLb, an LC capacitor Clca and Clcb connected to the switching element Qa and Qb, and a storage capacitor Csta and Cstb connected to the switching element Qa and Qb and the storage electrode line SL.

Each switching element Qa and Qb includes a thin film transistor (TFT) and is a three-terminal element provided on the lower panel 100. The switching element Qa and Qb has a control terminal connected to a gate line GL, an input terminal connected to a data line DLa and DLb, and an output terminal connected to an LC capacitor Clca and Clcb and a storage capacitor Csta and Cstb.

The storage capacitor Csta and Cstb functioning as an auxiliary capacitor for the LC capacitor Clca and Clcb is formed by overlapping a storage electrode line SL provided on the lower panel 100 with a sub-pixel electrode PEa and PEb via an insulator disposed there between. The storage electrode line SL is supplied with a predetermined voltage such as the common voltage Vcom. Alternatively, the storage capacitors Csta and Cstb may be formed by overlapping the sub-pixel electrodes PEa and PEb with a previous gate line immediately above it via an insulator.

Detailed descriptions of the LC capacitors Clca and Clcb, which were described above already, will be omitted.

In an LCD including this LC panel assembly 300, the signal controller 600 may receive input image signals R, G, and B for a pixel PX and convert them into output image signals DAT for the two sub-pixels PXa and PXb, which are transmitted to the data driver 500. The gray voltage generator 800 generates separate groups of gray voltages for the two subpixels PXa and PXb. The two groups of gray voltages are alternately supplied by the gray voltage generator 800 to the data driver 500 or alternately selected by the data driver 500 such that the two subpixels PXa and PXb are supplied with different voltages.

The values of the converted output image signals and the values of the gray voltages in each group may be determined such that the synthesis of gamma curves for the two subpixels PXa and PXb approaches a reference gamma curve at a front view. For example, the synthesized gamma curve at a front view coincides with the most suitable reference gamma curve at a front view, and the synthesized gamma curve at a lateral view is the most similar to the reference gamma curve at a front view.

Various disposition forms of the LC panel assembly will be described in detail with reference to FIG. 4 and FIG. 5.

Figure 4:
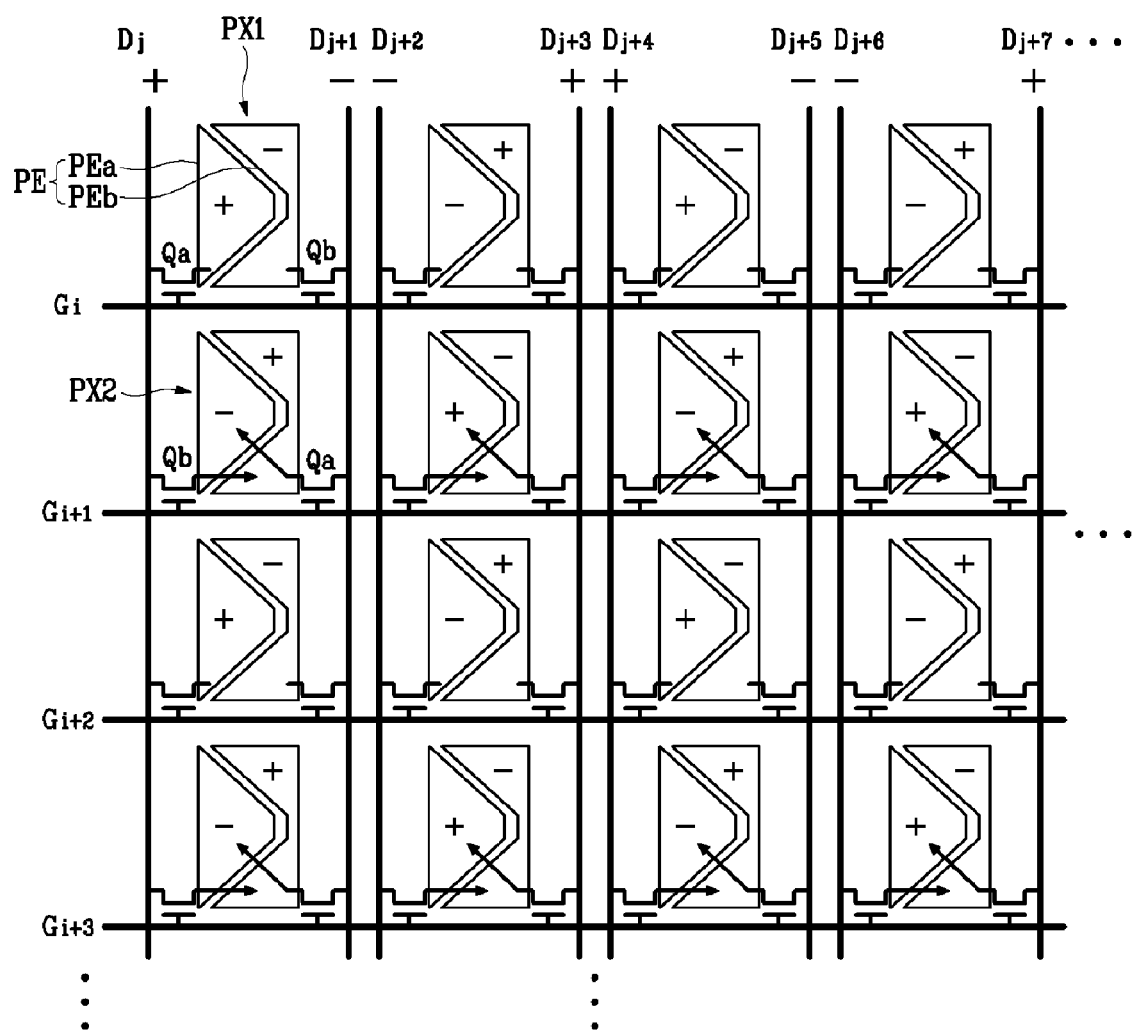
FIG. 4 is a schematic diagram showing disposition and polarities of pixels of an LCD according to an exemplary embodiment of the present invention.

FIG. 4 is a schematic diagram showing disposition of the pixels of an LC panel assembly according to an exemplary embodiment of the present invention.

Referring to FIG. 4, polarities of the data voltages applied to two data lines (for example, $D_j$ and $D_{j+1}$) connected to a pair of sub-pixel electrodes PEa and PEb forming a pixel electrode PE are opposite to each other. That is, the polarity of a data voltage of the data line $D_j$ located on the left side of a pixel electrode PE is positive (+), and the polarity of a data voltage of the data line $D_{j+1}$ located on the right side of the pixel electrode PE is negative (−). However, polarities of data voltages of two data lines (e.g., $D_{j+1}$ and $D_{j+2}$) disposed between two neighboring pixel electrodes PE are the same. In other words, the polarity of a plurality of data lines $D_j$, $D_{j+1}$, $D_{j+2}$, $D_{j+3}$, $D_{j+4}$, $D_{j+5}$, $D_{j+6}$, $D_{j+7}$ and $D_{j+8}$ is changed so that the same polarity is repeated once and then the polarity is changed to the opposite polarity, such as '+, −, −, +, +, −, −, +'. Since the polarity of neighboring data lines is the same, the load of the data lines is reduced to prevent a charging delay of data voltages, and the drive margin of the data driver 500 is increased.

Each first sub-pixel electrode PEa is connected to the first switching element Qa, and each second sub-pixel electrode PEb is connected to the second switching element Qb.

Looking at the pixel electrodes PE disposed in the first row, the first switching elements Qa are connected to the data lines $D_j$, $D_{j+2}$, $D_{j+4}$ and $D_{j+6}$ located on the left side of each pixel electrode PE, and the second switching elements Qb are connected to the data lines $D_{j+1}$, $D_{j+3}$, $D_{j+5}$ and $D_{j+7}$ located on the right side of each pixel electrode PE. Hereinafter, a pixel having this connecting relationship will be referred to as a first pixel PX1.

Looking at the pixel electrodes PE disposed in the second row, the first switching elements Qa are connected to the data lines $D_{j+1}$, $D_{j+3}$, $D_{j+5}$ and $D_{j+7}$ located on the right side of each pixel electrode PE, and the second switching elements Qb are connected to the data lines $D_j$, $D_{j+2}$, $D_{j+4}$ and $D_{j+6}$ located on the left side of each pixel electrode PE. Hereinafter, a pixel having this connecting relationship will be referred to as a second pixel PX2.

The third row, like the first row, comprises first pixels PX1 and the fourth row, like the second row, comprises second pixels PX2.

Therefore, in the LC panel assembly of FIG. 4, rows including first pixels PX1 and rows including second pixels PX2 are alternately arranged.

Accordingly, polarities of neighboring first sub-pixel electrodes PEa and neighboring second sub-pixel electrodes PEb in a row direction are opposite each other. Polarities of neighboring first sub-pixel electrodes PEa in a column direction are opposite each other, and polarities of neighboring second sub-pixel electrodes PEb in a column direction are also opposite each other.

Figure 5:
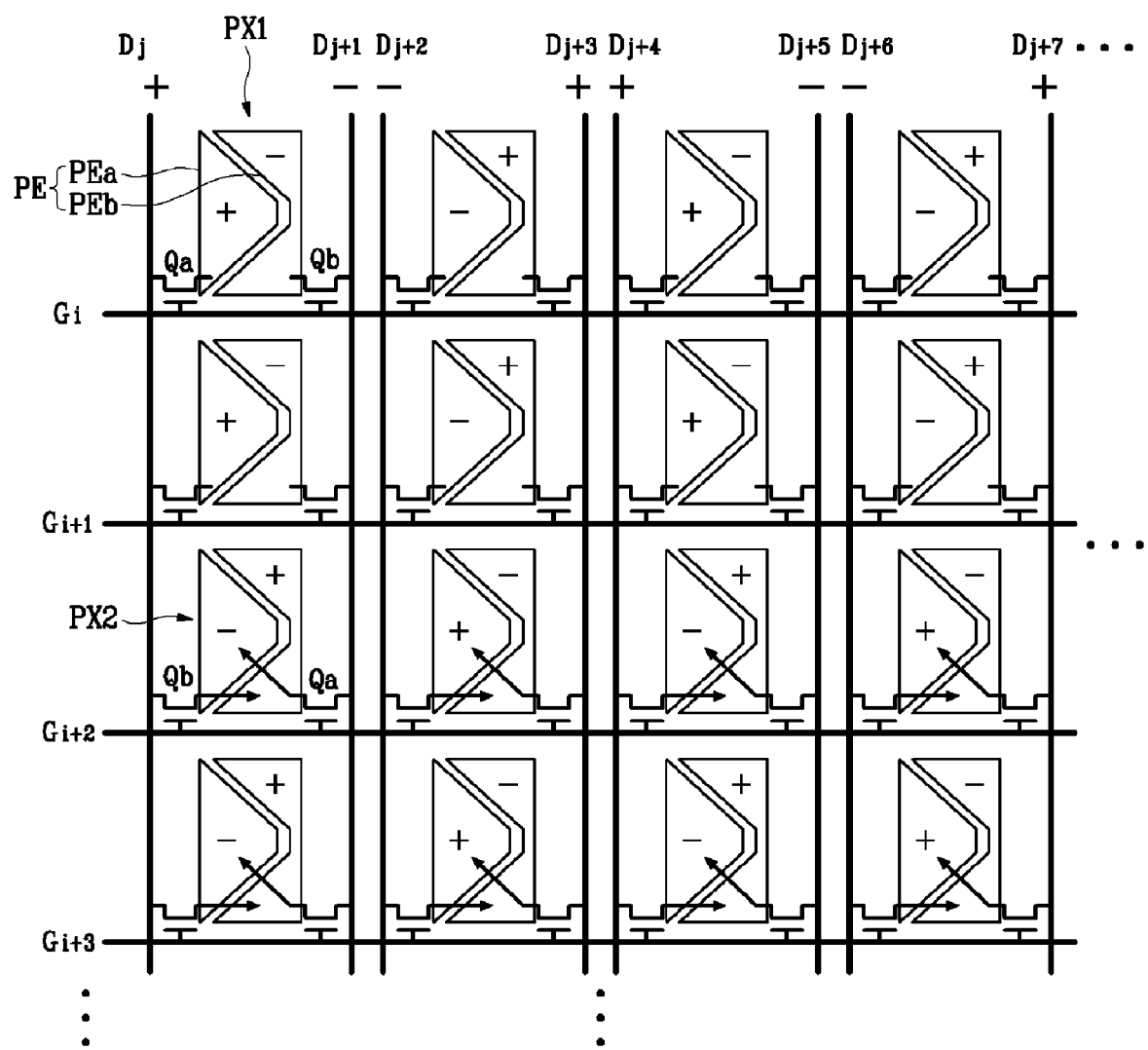
FIG. 5 is a schematic diagram showing disposition and polarities of pixels of an LCD according to another exemplary embodiment of the present invention.

FIG. 5 is a drawing showing disposition of pixels of an LC panel assembly according to another exemplary embodiment of the present invention.

In the LC panel assembly of FIG. 5, like FIG. 4, polarities of the data voltages applied to two data lines (for example, $D_j$ and $D_{j+1}$) connected to a pair of sub-pixel electrodes PEa and PEb forming a pixel electrode PE are opposite to each other. Polarities of the data voltages of two data lines (e.g., $D_{j+1}$ and $D_{j+2}$) disposed between two neighboring pixel electrodes PE are the same.

Each first sub-pixel electrode PEa is connected to the first switching element Qa, and each second sub-pixel electrode PEb is connected to the second switching element Qb.

As in the LC panel assembly of FIG. 4, the first row of pixel electrodes PE includes first pixels PX1.

However, unlike FIG. 4, the second row also includes first pixels PX1. The third row includes second pixels PX2 like the second row of FIG. 4, and the fourth row also includes second pixels PX2.

In other words, there are alternating pairs of rows, wherein one pair of rows includes second pixels PX2 and the other pair of rows includes first pixels PX 1.

Accordingly, the polarities of neighboring first sub-pixel electrodes PEa and neighboring second sub-pixel electrodes PEb in a row direction are opposite each other. However, the polarities of a first sub-pixel electrode PEa and one of its neighboring first sub-pixel electrodes PEa in a column direction are the same, while the polarities of the same first sub-pixel electrode PEa and its other neighboring first sub-pixel electrode PEa in the column direction are opposite each other. The polarities of a second sub-pixel electrode PEb and one of its neighboring second sub-pixel electrodes PEb in a column direction are also the same, while the polarities of the same second sub-pixel electrode PEb and its other neighboring second sub-pixel electrode PEb in the column direction are opposite each other. That is, the polarities of the neighboring first sub-pixel electrodes PEa or the neighboring second sub-pixel electrodes PEb in a column direction become '++−−' or '−−++', respectively.

Now, an LC panel assembly according to an exemplary embodiment of the present invention will be described in detail with reference to FIG. 6, FIG. 7, FIG. 8, FIG. 9, FIG. 10, and FIG. 11.

Figure 6:
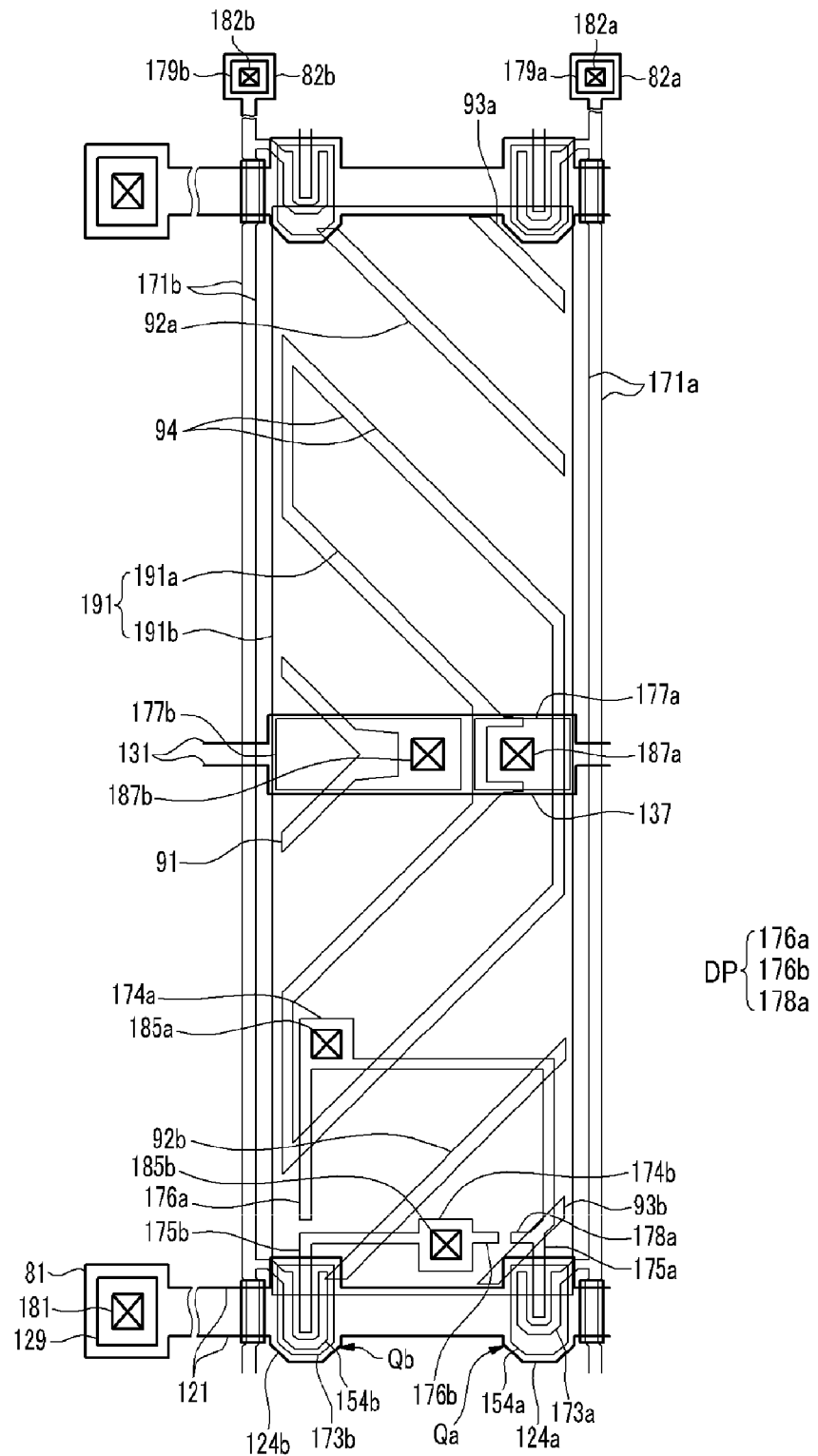
FIG. 6 is a layout view of a lower panel for a pixel of an LCD according to an exemplary embodiment of the present invention.
Figure 7:
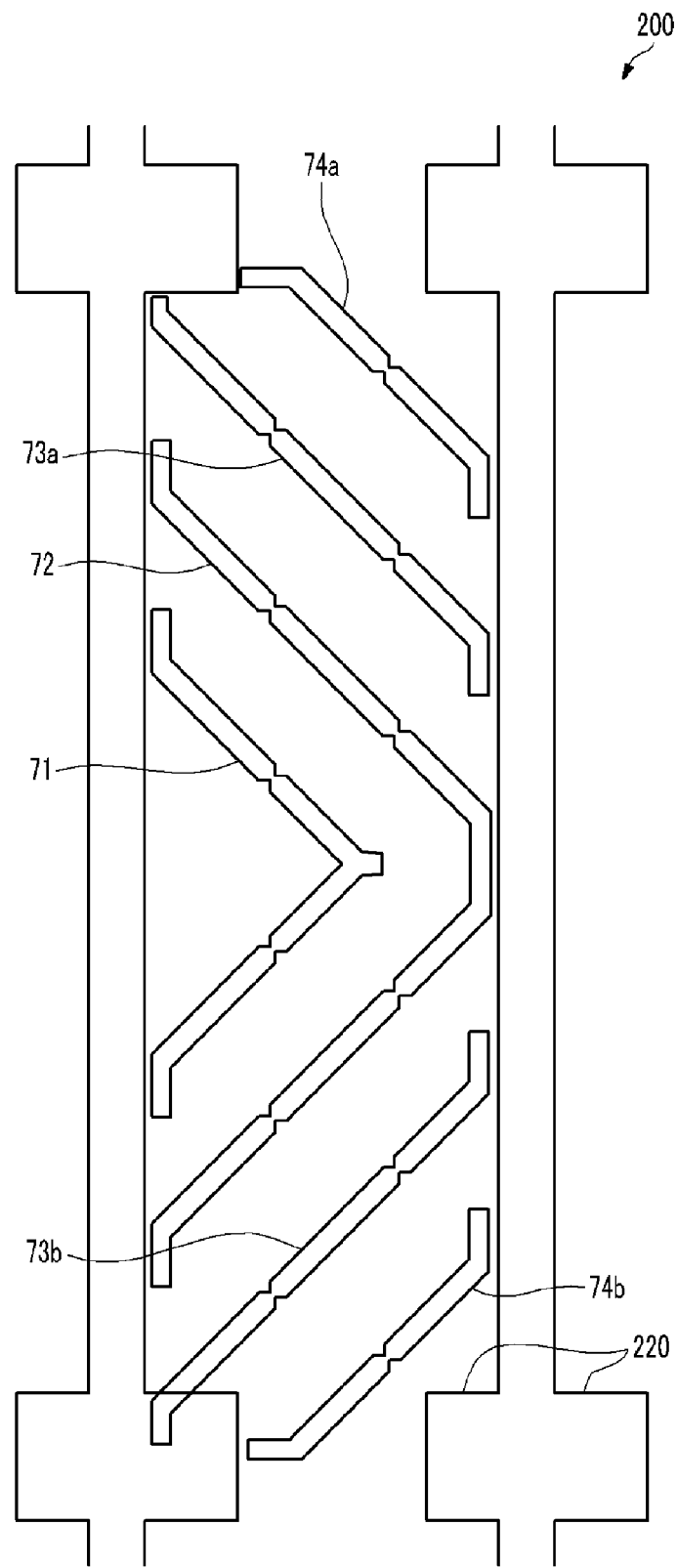
FIG. 7 is a layout view of an upper panel for a pixel of an LCD according to an exemplary embodiment of the present invention.
Figure 8:
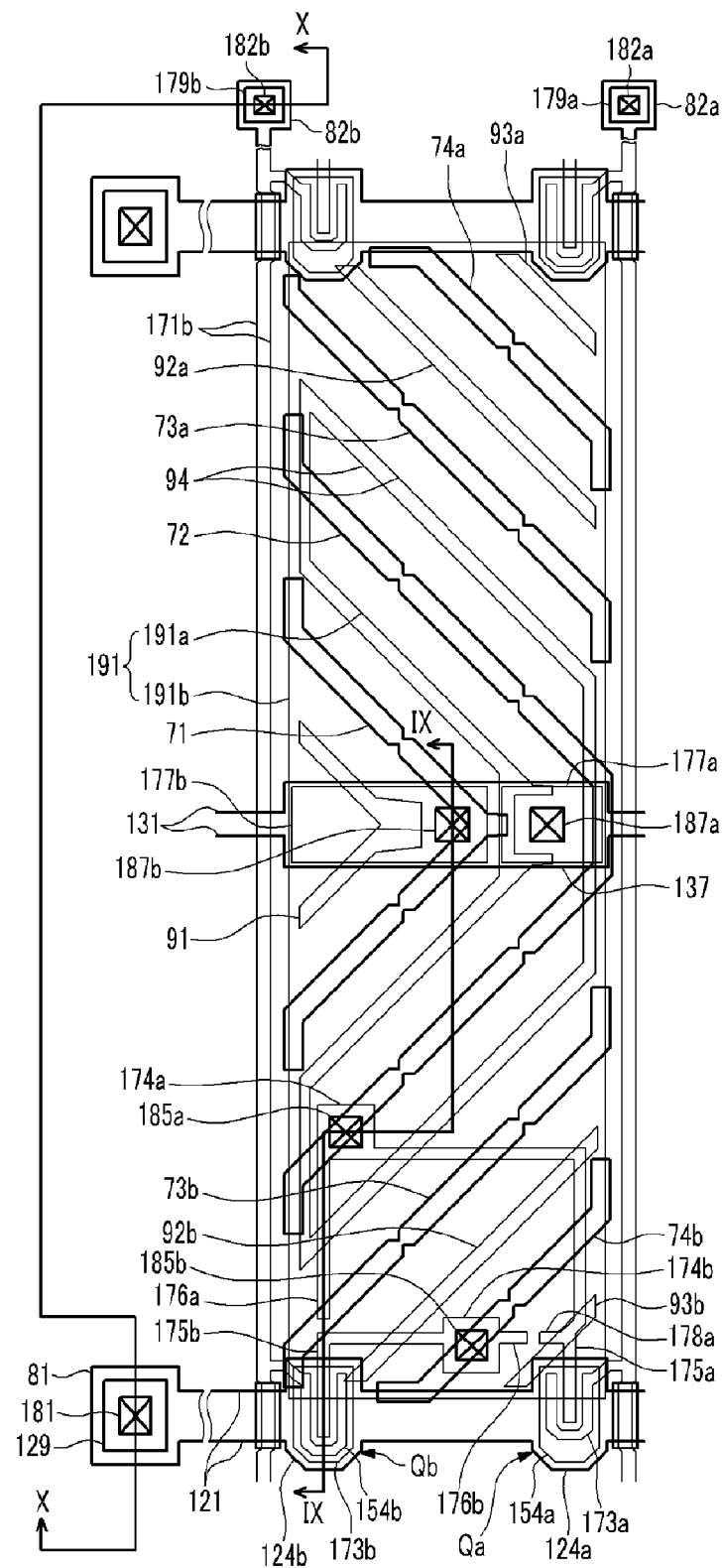
FIG. 8 is a layout view of an LCD including the lower panel shown in FIG. 6 and the upper panel shown in FIG. 7.
Figure 9:
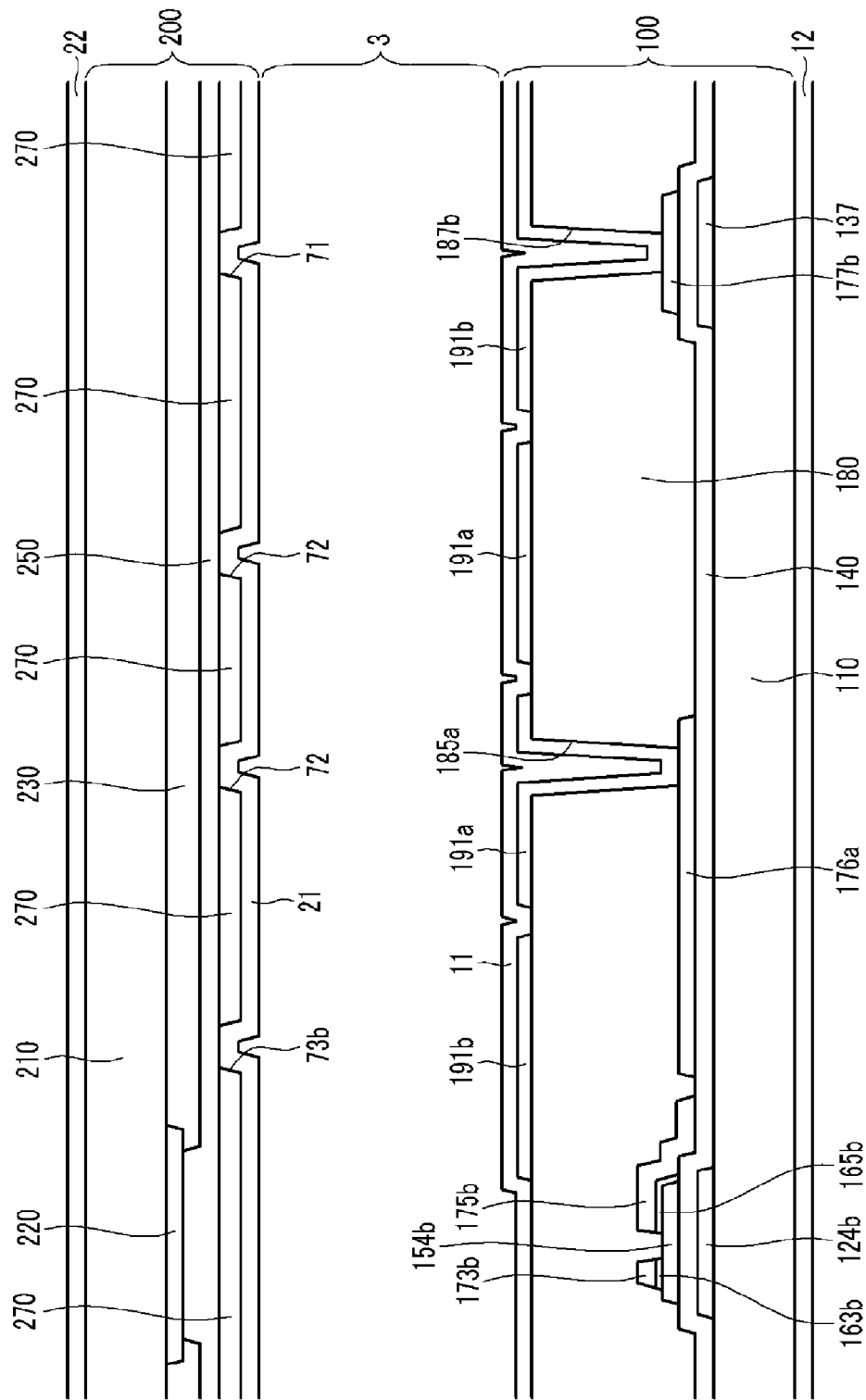
FIG. 9 and FIG. 10 are cross-sectional views of the LCD illustrated in FIG. 8 taken along line IX-IX and line X-X, respectively.
Figure 10:
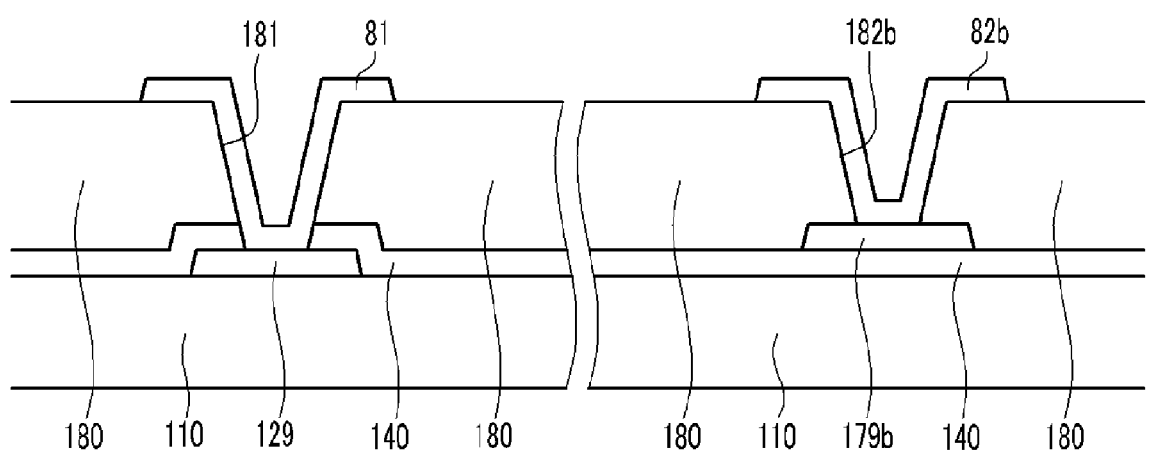

FIG. 6 is a layout view of a lower panel for a second pixel PX2 of an LCD according to an exemplary embodiment of the present invention, FIG. 7 is a layout view of a upper panel for a second pixel PX2 of an LCD according to an exemplary embodiment of the present invention, FIG. 8 is a layout view of an LCD including the lower panel shown in FIG. 6 and the upper panel shown in FIG. 7, and FIG. 9 and FIG. 10 are cross-sectional views of the second pixel PX2 illustrated in FIG. 8 taken along line IX-IX and line X_X, respectively.

An LCD according to an exemplary embodiment of the present invention includes a lower panel 100, an upper panel 200 opposing the lower panel 100, and an LC layer 3 interposed between the two panels 100 and 200.

First, the lower panel 100 will be described in detail with reference to FIG. 6, FIG. 8, FIG. 9, and FIG. 10.

A plurality of gate lines 121 and a plurality of storage electrode lines 131 are formed on an insulating substrate 110, which may be made of transparent glass.

The gate lines 121, which are separated from each other, extend substantially in a transverse direction and transmit gate signals. Each gate line 121 includes a plurality of projections forming a plurality of gate electrodes 124a and 124b and an end portion 129 having a large area for connection with another layer or an external driving circuit.

The storage electrode lines 131 extend substantially in a transverse direction and include a plurality of projections forming storage electrodes 137. The storage electrode lines 131 are supplied with a predetermined voltage, such as the common voltage Vcom that is applied to the common electrode 270 of the LCD.

The gate lines 121 and the storage electrode lines 131 may be made of an aluminum (Al) containing metal such as Al and an Al alloy, a silver (Ag) containing metal such as Ag and a Ag alloy, a copper (Cu) containing metal such as Cu and a Cu alloy, a molybdenum (Mo) containing metal such as Mo and a Mo alloy, chromium (Cr), tantalum (Ta), or titanium (Ti). Alternatively, the gate lines 121 and the storage electrode lines 131 may have a multi-layered structure including two conductive layers (not shown) having different physical properties. One of the two conductive layers may be made of a low resistivity metal, such as an Al containing metal, a Ag containing metal, or a Cu containing metal, for reducing signal delay or voltage drop in the gate lines 121 and the storage electrode lines 131. The other conductive layer may be made of a material, such as a Mo containing metal, Cr, Ti, or Ta, which has good contact characteristics when combined with other materials such as indium tin oxide (ITO) or indium zinc oxide (IZO). For example, the combination of two layers may include a lower Cr layer and an upper Al (alloy) layer or a lower Al (alloy) layer and an upper Mo (alloy) layer. However, the gate lines 121 and the storage electrode lines 131 may be made of various other metals or conductors as well.

Also, the lateral sides of the gate lines 121 and the storage electrode lines 131 are inclined relative to a surface of the substrate 110. The inclination angle thereof may range from about 30 degrees to about 80 degrees.

A gate insulating layer 140 may be made of silicon nitride (SiNx) and is formed on the gate lines 121 and the storage electrode lines 131.

A plurality of semiconductor islands 154a and 154b may be made of hydrogenated amorphous silicon (abbreviated to "a-Si") or polysilicon and are formed on the gate insulating layer 140.

A plurality of ohmic contact islands 163b and 165b may be made of silicide or n+ hydrogenated amorphous silicon (a-Si) heavily doped with an n-type impurity such as phosphorus (P) and are formed on the semiconductors 154a and 154b. The ohmic contact islands 163b and 165b are disposed in pairs on the semiconductors 154a and 154b, respectively.

The lateral sides of the semiconductors 154a and 154b and the ohmic contacts 163b and 165b are also inclined relative to a surface of the substrate 110. The inclination angle thereof may range from about 30 degrees to about 80 degrees.

A plurality of pairs of first and second data lines 171a and 171b, a plurality of pairs of first and second drain electrodes 175a and 175b, and a plurality of pairs of first and second electrode members 177a and 177b are formed on the ohmic contacts 163b and 165b and the gate insulating layer 140.

The data lines 171a and 171b extend substantially in the longitudinal direction crossing the gate lines 121 and the storage electrode lines 131 and transmit data signals. Each of the data lines 171a and 171b includes a plurality of source electrodes 173a and 173b, which are branched out toward the gate electrodes 124a and 124b, and an end portion 179a and 179b having an extended area for connection with another layer or an external driving circuit.

The drain electrodes 175a and 175b are separated from the data lines 171a and 171b and opposite the source electrodes 173a and 173b with respect to the gate electrodes 124a and 124b, respectively.

Each of the first and the second drain electrodes 175a and 175b includes a narrow end portion, which is partially surrounded by the source electrode 173a and 173b, which is curved in the shape of a "U".

The narrow end portion of each first drain electrode 175a extends substantially parallel to the first data line 171a. The first drain electrode 175a also curves vertically in a counterclockwise direction to extend parallel to the gate line 124. The first drain electrode 175a includes an expansion 174a having a large area, a branch 178a protruding vertically in a counterclockwise direction near the narrow end portion, and an extension 176a formed where the first drain electrode 175a curves vertically in a counterclockwise direction from the expansion 174a.

The second drain electrode 175b curves vertically in a clockwise direction from the narrow end portion to extend parallel to the gate line 124 and includes an expansion 174b having a large area and an extension 176b extending from the expansion 174b.

The first and second electrode members 177a and 177b are formed separately from the first and the second drain electrodes 175a and 175b and overlap the storage electrode 137. A dummy portion DP includes the branch 178a, the extension 176a, and the extension 176b.

The first and second gate electrodes 124a and 124b, the first and second source electrodes 173a and 173b, and the first and second drain electrodes 175a and 175b, along with the semiconductors 154a and 154b, form the first and second switching elements Qa and Qb having a channel formed in the semiconductors 154a and 154b disposed between the first and second source electrodes 173a and 173b and the first and second drain electrodes 175a and 175b.

The data lines 171a and 171b, the drain electrodes 175a and 175b, and the first and second electrode members 177a and 177b may be made of a refractory metal such as Mo, Cr, Ta, Ti, or an alloy thereof. Also, the data lines 171a and 171b and the drain electrodes 175a and 175b may have a multi-layered structure including a refractory metal layer (not shown) and a conductive layer (not shown) having low resistivity. For example, the multi-layered structure may include double layers of a lower Cr or Mo (alloy) layer and an upper Al (alloy) layer or triple layers of a lower Mo (alloy) layer, an intermediate Al (alloy) layer, and an upper Mo (alloy) layer. However, the data lines 171a and 171b, the drain electrodes 175a and 175b, and the first and second electrode members 177a and 177b may be made of various other metals or conductive materials as well.

The lateral sides of the data lines 171a and 171b, the drain electrodes 175a and 175b, and the first and the second electrode members 177a and 177b are inclined relative to a surface of the substrate 110, as are the gate lines 121 and the storage electrode lines 131. The inclination angles thereof may be in the range of about 30 degrees to about 80 degrees.

The gap between two immediately adjacent data lines 171a and 171b may be minimized, in consideration of the manufacturing process capacity and yield, so that a decrease in the aperture ratio due to an increase in the number of the data lines 171a and 171b may be minimized.

The ohmic contacts 165b are interposed between the underlying semiconductors 154a and 154b and the overlying data lines 171a and 171b and drain electrodes 175a and 175b thereon, and reduce the contact resistance there between.

A passivation layer 180 is formed on the data lines 171a and 171b, the drain electrodes 175a and 175b, the first and second electrode members 177a and 177b, and the exposed portions of the semiconductors 154a and 154b. The passivation layer 180 may be made of an inorganic insulator such as silicon nitride or silicon oxide, an organic insulator, or a low dielectric insulator. The organic insulator and the low dielectric insulator have dielectric constants which may be lower than 4.0. Examples of the low dielectric insulator include a Si:C:O and a Si:O:F formed by plasma enhanced chemical vapor deposition (PECVD). The passivation layer 180 may be made of an organic insulator having photosensitivity, and the surface thereof may be flat. However, the passivation layer 180 may have a double-layered structure including a lower inorganic layer and an upper organic layer in order to avoid harming the exposed portions of the semiconductors 154a and 154b and to take advantage of the excellent insulating characteristics of an organic layer.

The passivation layer 180 has a plurality of contact holes 182a, 182b, 187a, and 187b respectively exposing the end portions 179a and 179b of the data lines 171a and 171b and the first and second electrode members 177a and 177b, and the passivation layer 180 and the gate insulating layer 140 have a plurality of contact holes 181 respectively exposing the end portions 129 of the gate lines 121. The passivation layer 180 further includes a plurality of contact holes 185a and 185b respectively exposing expansions 174a and 174b of the first and second drain electrodes 175a and 175b.

A plurality of pixel electrodes 191, including first and second sub-pixel electrodes 191a and 191b, shielding electrodes (not shown), and a plurality of contact assistants 81, 82a and 82b, are formed on the passivation layer 180. The pixel electrodes 191 may be made of a transparent conductor such as ITO or IZO, or a reflective metal such as Al, Ag, Cr, or an alloy thereof.

The first and second sub-pixel electrodes 191a and 191b are connected to the first and second drain electrodes 175a and 175b through the contact holes 185a and 185b, respectively, and are supplied with a data voltage from the first and second drain electrodes 175a and 175b. A different data voltage is applied to each of a pair of sub-pixel electrodes 191a and 191b, which are preset for an input image signal. The size of the data voltages may be altered depending on the size and shape of the sub-pixel electrodes 191a and 191b and the area of the sub-pixel electrodes 191a and 191b may be different from each other. For example, the first sub-pixel electrode 191a may be supplied with a higher voltage than the second sub-pixel electrode 191b, and the area of the first sub-pixel electrode 191a may be smaller than that of the second sub-pixel electrode 191b.

The sub-pixel electrodes 191a and 191b supplied with data voltages generate electric fields in cooperation with the common electrode 270 so that the orientations of the LC molecules in the LC layer 3 interposed between the two sub-pixel electrodes 191a and 191b and the common electrode 270 are determined.

Also, as described above, each sub-pixel electrode 191a and 191b and the common electrode 270 form an LC capacitor Clca and Clcb that stores the applied voltages even after the switching element Qa and Qb is turned off. The first and second sub-pixel electrodes 191a and 191b and the first and second electrode members 177a and 177b connected thereto overlap a storage electrode 137 to form first and second storage capacitors Csta and Cstb, which are connected in parallel to the LC capacitors Clca and Clcb to enhance the voltage storing capacity thereof.

The outer boundary of each pixel electrode 191 is substantially rectangular.

A pair of first and second sub-pixel electrodes 191a and 191b forming a pixel electrode 191 engage with each other with a gap 94 disposed there between, and the first sub-pixel electrode 191a is interposed in the center of the second sub-pixel electrode 191b.

A center cutout 91, upper cutouts 92a and 93a, and lower cutouts 92b and 93b are formed in the second sub-pixel electrode 191b, and the second sub-pixel electrode 191b is divided into a plurality of regions (partitions) by these cutouts 91, 92a, 92b, 93a, and 93b. The cutouts 91, 92a, 92b, 93a, and 93b are substantially inversely symmetrical with respect to the storage electrode line 131.

The lower and upper cutouts 92a, 92b, 93a, and 93b obliquely extend from a right edge of the pixel electrode 191 to the upper or lower portion of the left edge of the pixel electrode 191 and are disposed at lower and upper halves of the pixel electrode 191 with respect to the storage electrode line 131, respectively. The lower and upper cutouts 92a, 92b, 93a, and 93b are at an angle of about 45 degrees to the gate line 121 and extend perpendicular to each other.

The center cutout 91 extends along the storage electrode line 131 and has an inlet toward the left edge of the pixel electrode 191. The center cutout 91 has a central transverse portion and a pair of oblique portions. The central transverse portion extends approximately from the right of the pixel electrode 191 to the left along the storage electrode line 131. The oblique portions extend from an end of the central transverse portion to the left edge of the pixel electrode 191 and are approximately parallel to the lower and the upper cutouts 92a, 92b, 93a, and 93b, respectively.

Therefore, the lower half of the pixel electrode 191 is partitioned into 5 partitions by the center cutout 91, the gap 94, and the lower cutouts 92b and 93b, and the upper half of the pixel electrode 191 also is partitioned into 5 partitions by the center cutout 91, the gap 94, and the upper cutouts 92a and 93a. The number of regions and/or the number of cutouts may vary according to the size of a pixel, the ratio of the transverse and longitudinal edges of the pixel electrode, the type or characteristics of the LC layer 3, or other design factors.

The contact assistants 81, 82a, and 82b are connected through the contact holes 181, 182a, and 182b to the end portions 129 of the gate lines 121 and the end portions 179a and 179b of the data lines 171a and 171b, respectively. The contact assistants 81 and 82 aid in the adhesion and protection of the exposed end portions 129 and 179 of the gate lines 121 and the data lines 171 to external apparatuses.

Next, the upper panel 200 will be described with reference to FIG. 7, FIG. 8, and FIG. 9.

A light blocking member 220 is formed on an insulating substrate 210 which may be made of transparent glass or plastic. The light blocking member 220 is also called a black matrix and prevents light leakage. The light blocking member 220 includes linear portions corresponding to the data lines 171 and planar portions corresponding to the witching elements Qa and Qb, and it prevents light leakage between pixel electrodes 191 and defines openings that face the pixel electrode 191. Alternatively, the light blocking member 220 may have a plurality of openings that face the pixel electrodes 191 and have substantially the same shape as the pixel electrode 191.

A plurality of color filters 230 are also formed on the substrate 210. The color filters 230 are disposed in the areas enclosed by the light blocking member 220, and they may extend in a longitudinal direction substantially along the pixel electrode 191. Each of the color filters 230 may represent one of the primary colors, for example, red, green, or blue.

An overcoat 250 is formed on the color filters 230 and the light blocking member 220. The overcoat 250 may be made of an (organic) insulator and it prevents the color filters 230 from being exposed and also provides a flat surface. The overcoat 250 may be omitted.

A common electrode 270 is formed on the overcoat 250. The common electrode 270 may be made of a transparent conductive material such as ITO or IZO.

The common electrode 270 has a plurality of sets of cutouts 71, 72, 73a, 73b, 74a and 74b.

A set of cutouts 71, 72, 73a, 73b, 74a and 74b faces a pixel electrode 191 and includes first and second center cutouts 71 and 72, upper cutouts 73a and 74a, and lower cutouts 73b and 74b. Each of the cutouts 71, 72, 73a, 73b, 74a and 74b is disposed between adjacent cutouts 91, 92a, 92b, 93a, and 93b of the pixel electrode 191. Also, each of the cutouts 71, 72, 73a, 73b, 74a and 74b has at least one oblique branch extending parallel to the lower cutouts 92a and 93a or the upper cutouts 92b and 93b of the pixel electrode 191.

Each of the lower and upper cutouts 73a, 73b, 74a, and 74b includes an oblique branch, a transverse branch, and a longitudinal branch. The oblique branch extends approximately from a right edge of the pixel electrode 191 to an upper or lower portion of the left edge of the pixel electrode 19 1and is substantially parallel to the lower or upper cutouts 92a, 92b, 93a, and 93b of the pixel electrode 191. The transverse branch and the longitudinal branch extend from respective ends of the oblique branch along the edges of the pixel electrode 191, overlapping the edges of the pixel electrode 191 and making obtuse angles with the oblique branch.

Each of the first and second center cutouts 71 and 72 includes a pair of oblique branches and a pair of terminal longitudinal branches. The central transverse branch extends approximately from the right of the pixel electrode 191 to the left along the transverse center line. The oblique branches extend from an end of the central transverse branch toward the left edge of the pixel electrode 191 and are substantially parallel to the lower and upper cutouts 73a, 73b, 74a, and 74b, respectively. The terminal longitudinal branches extend from the respective ends of the oblique branches along the left edge of the pixel electrode 191, overlapping the left edge of the pixel electrode 191 and making obtuse angles with the oblique branches.

Each of the oblique portions of the cutouts 71, 72, 73a, 73b, 74a and 74b has triangular notches. Each of the notches may have the shape of a rectangle, a trapezoid, or a semicircle, and may be convex or concave. The notches determine the orientations of the LC molecules on the region boundaries corresponding to the cutouts 71, 72, 73a, 73b, 74a and 74b.

The number or direction of the cutouts 71, 72, 73a, 73b, 74a and 74b may vary depending on design factors.

Alignment layers 11 and 21 are coated on inner surfaces of the panels 100 and 200 and may be homeotropic.

Polarizers 12 and 22 are provided on outer surfaces of the panels 100 and 200 and their polarization axes may be perpendicular to each other. One of the polarization axes is preferably parallel to the gate lines 121.

The LCD may include a backlight unit (not shown) for supplying light to the polarizers 12 and 22, the panels 100 and 200, and the LC layer 3.

The LC layer 3 may be in a state of negative dielectric anisotropy, and the LC molecules in the LC layer 3 are aligned such that their long axes are substantially vertical to the surfaces of the panels 100 and 200 in the absence of an electric field. Therefore, light incident to the liquid crystal layer 3 is blocked and cannot pass through the crossed polarizers 12 and 22.

When a common voltage is applied to the common electrode 270 and a data voltage is applied to a pixel electrode 191, an electric field substantially perpendicular to the surfaces of the panels 100 and 200 is generated. The LC molecules tend to change their orientations in response to the electric field such that their long axes are perpendicular to the electric field direction. Hereinafter, both the pixel electrode 191 and the common electrode 270 are commonly referred to as "field-generating electrodes."

Meanwhile, the cutouts 91, 92a, 92b, 93a, and 93b of the pixel electrodes 191 and the cutouts 71, 72, 73a, 73b, 74a and 74b of the common electrode 270 of the field-generating electrodes 191 and 270 and the oblique edges of the pixel electrodes 191 that are parallel to those cutouts 91, 92a, 92b, 93a, and 93b and 71, 72, 73a, 73b, 74a and 74b distort the electric field to have a horizontal component that determines the tilt directions of the LC molecules. The horizontal component of the electric field is perpendicular to the oblique edges of the cutouts 91, 92a, 92b, 93a, and 93b and 71, 72, 73a, 73b, 74a and 74b and the oblique edges of the pixel electrodes 191.

Referring to FIG. 8, a set of common electrode cutouts 71, 72, 73a, 73b, 74a and 74b and a set of pixel electrode cutouts 91, 92a, 92b, 93a, and 93b divide a pixel electrode 191 into a plurality of sub-areas, and each sub-area has two major edges making oblique angles with the primary edges of the pixel electrode 191. Since the LC molecules on each sub-area tilt perpendicular to the major edges, the azimuthal distribution of the tilt directions are localized in four directions. Therefore, by varying the tilt direction of the LC molecules, it may be possible to increase the reference viewing angle of the LCD.

At least one of the cutouts 91, 92a, 92b, 93a, and 93b and 71, 72, 73a, 73b, 74a and 74b may be substituted with protrusions or depressions, and the shapes and the arrangements of the cutouts 91, 92a, 92b, 93a, and 93b and 71, 72, 73a, 73b, 74a and 74b may be modified.

Now, the first pixel PX1 of an LCD according to an exemplary embodiment of the present invention will be described in detail with reference to FIG. 11.

Figure 11:
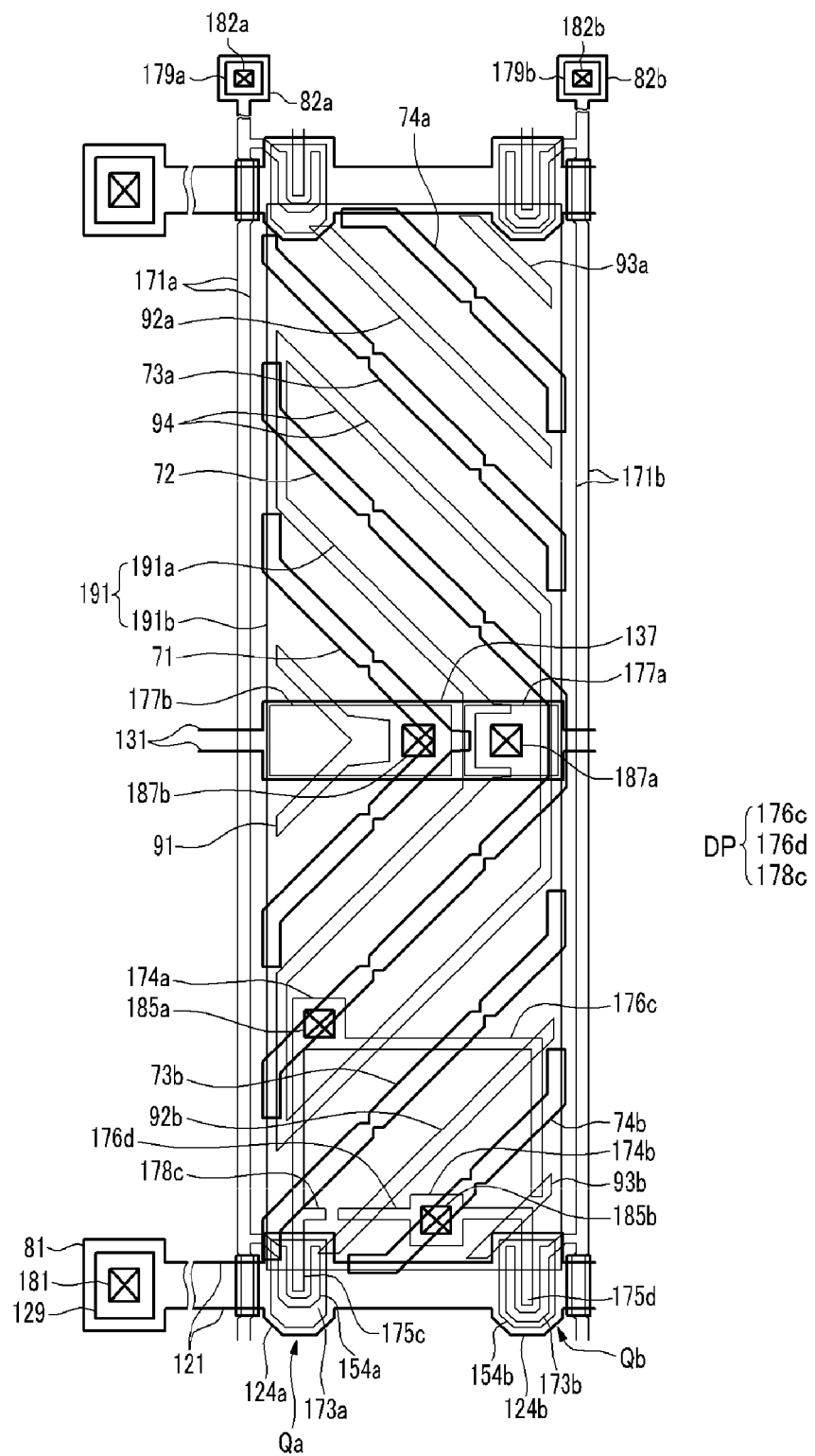
FIG. 11 is a layout view of an example of a pixel of an LCD according to an exemplary embodiment of the present invention.

FIG. 11 is a layout view of a first pixel PX1 of an LCD according to an exemplary embodiment of the present invention.

Referring to FIG. 11, the first pixel PX1 of an LCD according to an exemplary embodiment of the present invention includes a lower panel (not shown) and an upper panel (not shown) facing each other and an LC layer (not shown) interposed there between.

The layered structure of the LC panel assembly according to the present exemplary embodiment is similar to the layered structure of the LC panel assembly shown in FIG. 6, FIG. 7, FIG. 8, FIG. 9, and FIG. 10.

Regarding the lower panel, a plurality of gate conductors including a plurality of gate lines 121 and a plurality of storage electrode lines 131 are formed on an insulating substrate (not shown). Each of the gate lines 121 includes gate electrodes 124a and 124b and an end portion 129, and each of the storage electrode lines 131 includes storage electrodes 137. A gate insulating layer (not shown) is formed on the gate conductors 121 and 131. First and second semiconductor islands 154a and 154b are formed on the gate insulating layer and a plurality of ohmic contacts (not shown) are formed thereon. Data conductors including a plurality of first and second data lines 171a and 171b, a plurality of first and second drain electrodes 175c and 175d, and first and second electrode members 177a and 177b are formed on the ohmic contacts and the gate insulating layer. The first and second data lines 171a and 171b include a plurality of first and second source electrodes 173a and 173b and end portions 179a and 179b. A passivation layer (not shown) is formed on the data conductors 171a, 171b, 175c, 175d, 177a, and 177b and the exposed portions of the semiconductors 154a and 154b, and the passivation layer and the gate insulating layer have a plurality of contact holes 181, 182a, 182b, 185a, 185b, 187a, and 187b. A plurality of pixel electrodes 191, including first and second sub-pixel electrodes 191a and 191b and a plurality of contact assistants 81, 81a, and 82b are formed on the passivation layer. An alignment layer (not shown) is formed on the pixel electrodes 191, the contact assistants 81, 81a, and 82b, and the passivation layer.

In the first pixel PX1 shown in FIG. 11, unlike the second pixel PX2 shown in FIG. 6, FIG. 7, FIG. 8, FIG. 9, and FIG. 10, the first data line 171a is disposed on the left side of a pixel electrode 191 and the second data line 171b is disposed on the right side of the pixel electrode 191. That is, the first switching element Qa, which consists of the first semiconductor 154a, the first source electrode 173a, and the first drain electrode 175a, is disposed on the left side of the pixel electrode 191, and the second switching element Qb, which consists of the second semiconductor 154b, the second source electrode 173b, and the second drain electrode 175b, is disposed on the right side of the pixel electrode 191.

The narrow end of the first drain electrode 175c extends substantially parallel to the first data line 171a. The first drain electrode 175c also curves vertically in a clockwise direction to extend parallel to the gate line 121. The first drain electrode 175c includes an expansion 174a having a large area, a branch 178c protruding horizontally near the narrow end portion, and an extension 176c curving horizontally in a clockwise direction from the expansion 174a and then curving vertically in a clockwise direction.

The second drain electrode 175d curves horizontally in a counterclockwise direction from the narrow end portion to extend parallel to the gate line 121 and includes an expansion 174b having a large area and an extension 176d extending from the expansion 174b. A dummy portion DP includes the branch 178c, the extension 176c, and the extension 176d.

Comparing FIG. 8 with FIG. 11, the disposition of the first and second data lines 171a and 171b and the first and second switching elements Qa and Qb are different, but the shapes of the first and second drain electrodes 175a, 175b, 175c, and 175d are substantially the same. That is, even though the connecting relationship between the pixel electrode 191 and the first and second switching elements Qa and Qb in the first and second pixels PX1 and PX2 is different, the electrical and optical characteristics of each pixel PX1 and PX2 may be adjusted to be the same. Accordingly, there may be no difference in luminance when the first and second pixels PX1 and PX2 are viewed from the front and when the first and second pixels PX1 and PX2 are viewed from an angle.

Even though the shapes of the first and second drain electrodes 175a, 175b, 175c, and 175d were described with reference to FIG. 8, FIG. 9, FIG. 10, and FIG. 11 above, the present invention is not limited thereto, and various shapes may be adopted while the first and second pixels PX1 and PX2 have the same planar shapes.

Next, the operation of the liquid crystal display will be described in detail.

Referring to FIG. 1 again, the signal controller 600 is supplied with input image signals R, G, and B and input control signals, for example, a vertical synchronization signal Vsync, a horizontal synchronization signal Hsync, a main clock MCLK, and a data enable signal DE, for controlling the display of the input image signals R, G, and B from an external graphics controller (not shown). On the basis of the input control signals and the input image signals R, G, and B, the signal controller 600 processes the input image signals R, G, and B and generates gate control signals CONT1 and data control signals CONT2. Then, the signal controller 600 transmits the gate control signals CONT1 to the gate driver 400 and transmits the processed image signals DAT and the data control signals CONT2 to the data driver 500.

The gate control signals CONT1 include a scanning start signal STV to start scanning of a gate-on voltage Von, a gate clock signal CPV for controlling the output time of the gate-on voltage Von, and an output enable signal OE for defining the duration width of the gate-on voltage Von.

The data control signals CONT2 include a horizontal synchronization start signal STH for starting data transmission for a row of sub-pixels PXa and PXb, a load signal LOAD to apply corresponding data voltages to the data lines $D_1$-$D_{2m}$, and a data clock signal HCLK. The data control signal CONT2 may further include an inversion signal RVS for reversing the polarity of the data voltages with respect to the common voltage Vcom (hereinafter, the "polarity of the data voltages with respect to the common voltage Vcom" is referred to as "polarity of the data voltages").

Responding to the data control signals CONT2 from the signal controller 600, the data driver 500 sequentially receives and shifts image data DAT for a row of sub-pixels PXa and PXb, selects gray voltages corresponding to the respective image data DAT among gray voltages from the gray voltage generator 800, converts the image data DAT into corresponding analog data voltages, and applies the analog data voltages to the corresponding data lines $D_1$-$D_{2m}$.

The gate driver 400 applies the gate-on voltage Von to the gate lines $G_1$-$G_n$ in response to the gate control signals CONT1 from the signal controller 600, thereby turning on the switching elements Qa and Qb connected to the gate lines $G_1$-$G_n$, and accordingly, data voltages applied to data lines $D_1$-$D_{2m}$ are applied to the corresponding sub-pixels PXa and PXb through the turned-on switching elements Qa and Qb.

The differences between the data voltages applied to the sub-pixels PXa and PXb and the common voltage Vcom appear as charge voltages of each of the LC capacitors Clca and Clcb, that is, sub-pixel voltages. The orientation of the LC molecules varies depending on the intensity of the sub-pixel voltages and thus, the polarization of light passing through the LC layer 3 varies. As a result, the transmittance of the light is varied by the polarizers 12 and 22 attached to the panels 100 and 200.

An input image data set is converted into a pair of output image data sets, which gives different transmittances to each of a pair of sub-pixels PXa and PXb. Consequently, the two sub-pixels PXa and PXb represent different gamma curves. The gamma curve of one pixel PX is a composite curve of the gamma curves. The synthesized gamma curve for the front view is determined to be equal to the reference gamma curve for the front view that is most suitable, and the synthesized gamma curve for the side view is determined to be closest to the reference gamma curve for the front view. In this way, image data may be converted and lateral visibility may be improved. Also, as described above, the area of the first sub-pixel electrode 191a supplied with a relatively high voltage is smaller than the area of the second sub-pixel electrode 191b, which may minimize distortion of the synthesized gamma curve for the side view.

After one horizontal period (which is also denoted as "1H") [one period of the horizontal synchronization signal Hsync and the data enable signal DE], the data driver 500 and the gate driver 400 repeat the same procedure for the next row of sub-pixels PXa and PXb. In this way, all gate lines $G_1$-$G_n$ are sequentially supplied with the gate-on voltage Von during a frame, thereby applying data voltages to all sub-pixels PXa and PXb. When the next frame starts, the inversion signal RVS applied to the data driver 500 is controlled such that the polarity of the data voltage applied to each of the sub-pixels PXa and PXb is reversed to be opposite the polarity in the previous frame (which is referred to as "frame inversion").

The data driver 500 also reverses the polarity of the data voltages flowing in neighboring data lines $D_1$-$D_{2m}$ during one frame and accordingly, the polarity of the voltage of the sub-pixel receiving the data voltage also varies. Depending on the connecting relationship between the data driver 500 and the data lines $D_1$-$D_{2m}$, the polarity inversion pattern generated by the data driver 500 is different from the polarity inversion pattern of sub-pixel voltages appearing on the screen of the LC panel assembly 300. Hereinafter, the polarity inversion of the data driver 500 is referred to as "driver inversion," and the polarity inversion appearing on the screen is referred to as "apparent inversion." Also, for convenience of description, "the polarity of the sub-pixel voltage in the sub-pixel PXa and PXb" is abbreviated to the "polarity of the sub-pixel PXa and PXb", and "the polarity of the pixel voltage in the pixel PX" is abbreviated to the "polarity of the pixel PX".

Since apparent inversion types of LCDs according to various exemplary embodiments of the present invention were described above with the polarities of the first and second sub-pixel electrodes PEa and PEb of FIG. 4 and FIG. 5, further description will be omitted.

Now, another exemplary embodiment of the present invention will be described in detail with reference to FIG. 12, FIG. 13, and FIG. 14.

Figure 12:
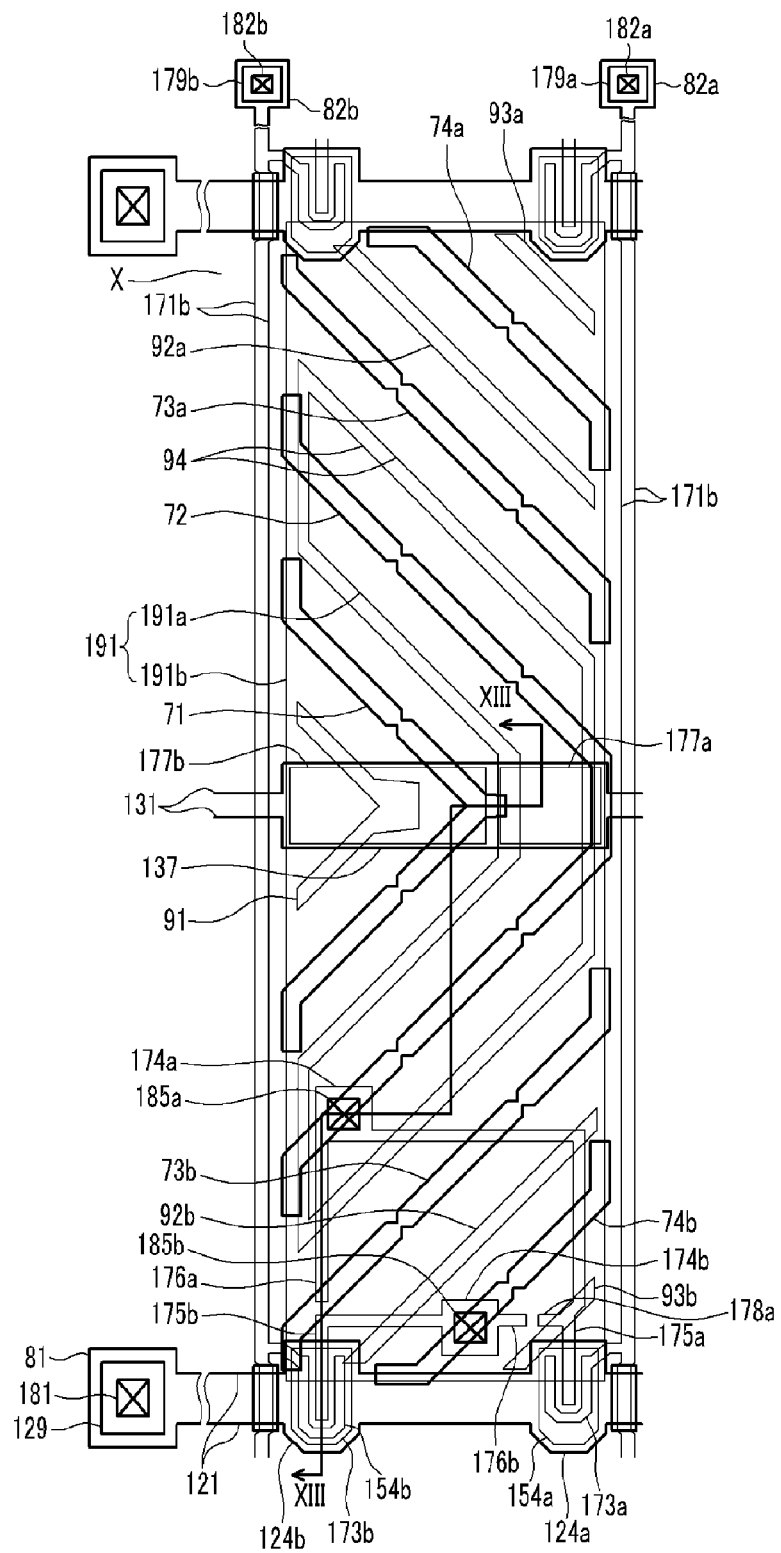
FIG. 12 is a layout view of another example of a pixel of an LCD according to another exemplary embodiment of the present invention.
Figure 13:
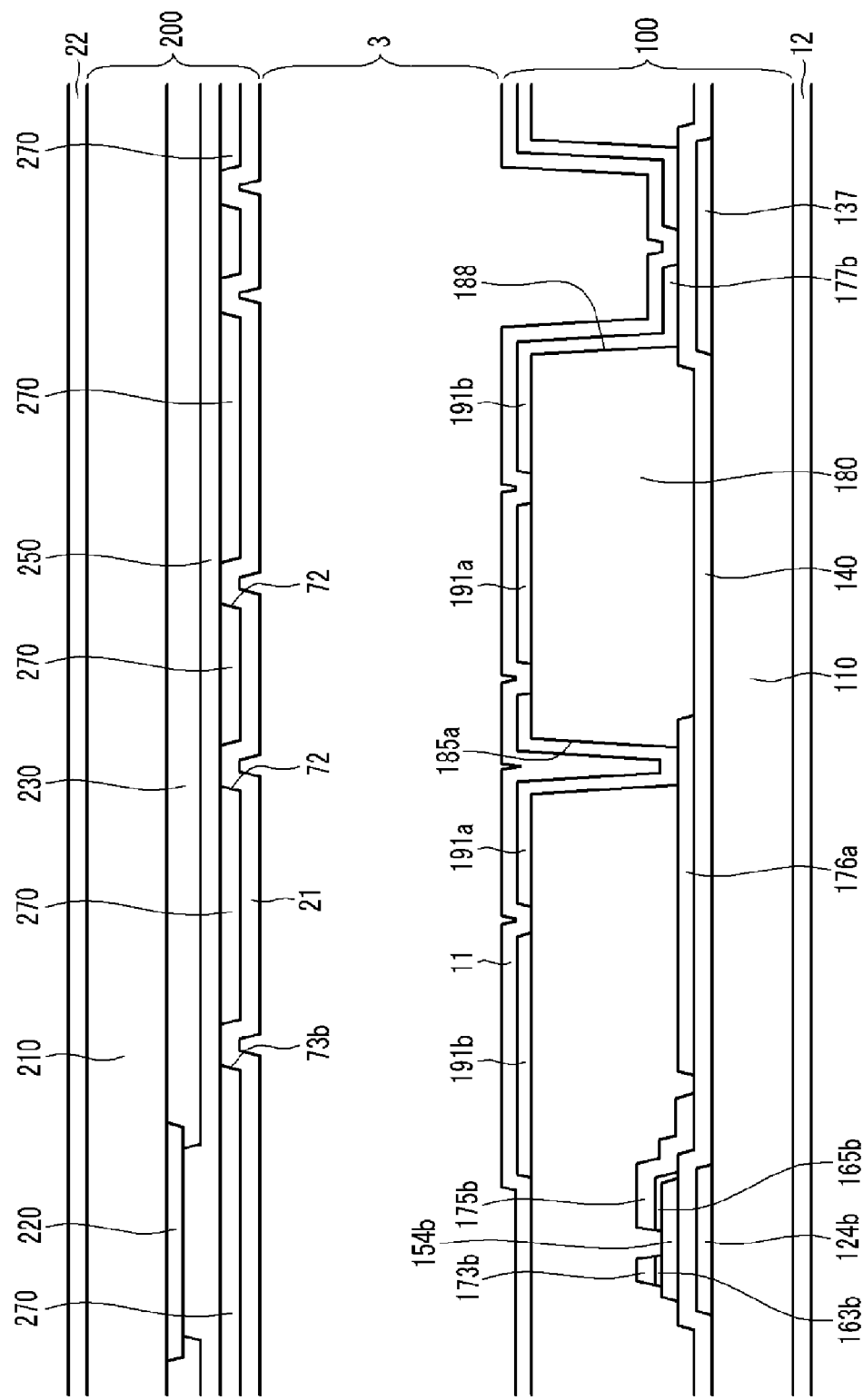
FIG. 13 is a cross-sectional view of the LCD shown in FIG. 12 taken along the line XIII-XIII.

FIG. 12 is a layout view of a second pixel PX2 of an LCD according to another exemplary embodiment of the present invention, and FIG. 13 is a cross-sectional view of the LCD shown in FIG. 12 taken along line XIII-XIII.

Referring to FIG. 12 and FIG. 13, the second pixel PX2 of an LCD according to an exemplary embodiment of the present invention includes a lower panel (not shown) and an upper panel (not shown) opposing each other and an LC layer (not shown) interposed between the two panels.

The layered structure of the LC panel assembly according to the present exemplary embodiment is similar to the layered structure of the LC panel assembly shown in FIG. 6, FIG. 7, FIG. 8, FIG. 9, and FIG. 10.

Regarding the lower panel, a plurality of gate conductors including a plurality of gate lines 121 and a plurality of storage electrode lines 131 are formed on an insulating substrate (not shown). Each of the gate lines 121 includes gate electrodes 124a and 124b and an end portion 129, and each of the storage electrode lines 131 includes storage electrodes 137. A gate insulating layer (not shown) is formed on the gate conductors 121 and 131. First and second semiconductor islands 154a and 154b are formed on the gate insulating layer and a plurality of ohmic contacts (not shown) are formed thereon. Data conductors including a plurality of first and second data lines 171a and 171b, a plurality of first and second drain electrodes 175a and 175b, and first and second electrode members 177a and 177b are formed on the ohmic contacts and the gate insulating layer. The first and second data lines 171a and 171b include a plurality of first and second source electrodes 173a and 173b and end portions 179a and 179b. A passivation layer (not shown) is formed on the data conductors 171a, 171b, 175a, and 175b and the exposed portions of the semiconductors 154a and 154b, and the passivation layer and the gate insulating layer have a plurality of contact holes 181, 182a, 182b, 185a, and 185b. A plurality of pixel electrodes 191, including first and second sub-pixel electrodes 191a and 191b, and a plurality of contact assistants 81, 82a, and 82b are formed on the passivation layer. An alignment layer (not shown) is formed on the pixel electrodes 191, the contact assistants 81, 82a, and 82b, and the passivation layer.

In the LCD of FIG. 12, unlike that of FIG. 8 and FIG. 9, the passivation layer 180 is removed where the storage electrodes 137 and the electrode members 177a and 177b overlap. That is, only the gate insulating layer 140 exists between the storage electrodes 137 and the electrode members 177a and 177b. Also, there are no contact holes connecting the pixel electrodes 191 and the electrode members 177a and 177b.

Consequently, a storage capacitor (not shown) is formed by overlapping of the storage electrode 137 and the electrode member 177a and 177b with the gate insulating layer 140 as its dielectric material. This may improve the voltage storing capacity because the distance between the storage electrode 137 and the electrode member 177a and 177b is shorter than that of FIG. 8.

Now, a first pixel PX1 of an LCD according to another exemplary embodiment of the present invention will be described in detail with reference to FIG. 14.

Figure 14:
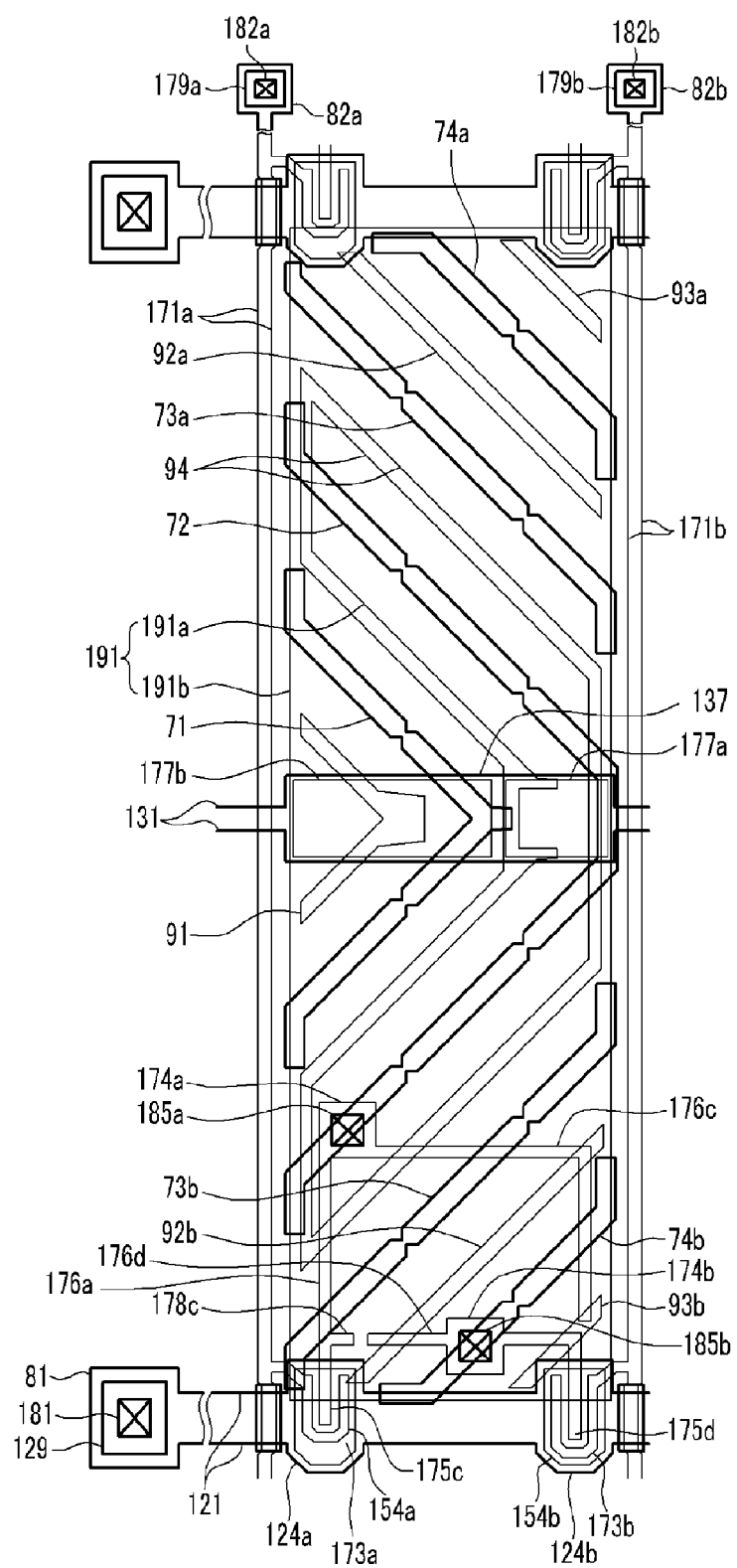
FIG. 14 is a layout view of another example of a pixel of an LCD according to another exemplary embodiment of the present invention.

FIG. 14 is a layout view of a first pixel PX1 of an LCD according to another exemplary embodiment of the present invention.

Referring to FIG. 14, the first pixel PX1 of an LCD according to an exemplary embodiment of the present invention includes a lower panel (not shown) and an upper panel (not shown) opposing each other and an LC layer (not shown) interposed between the two panels.

The layered structure of the LC panel assembly according to the present exemplary embodiment is mostly similar to the layered structure of the LC panel assembly illustrated in FIG. 6, FIG. 7, FIG. 8, FIG. 9, and FIG. 10.

Regarding the lower panel, a plurality of gate conductors including a plurality of gate lines 121 and a plurality of storage electrode lines 131 are formed on an insulating substrate (not shown). Each of the gate lines 121 includes gate electrodes 124a and 124b and an end portion 129, and each of the storage electrode lines 131 includes storage electrodes 137. A gate insulating layer (not shown) is formed on the gate conductors 121 and 131. First and second semiconductor islands 154a and 154b are formed on the gate insulating layer, and a plurality of ohmic contacts (not shown) are formed thereon. Data conductors including a plurality of first and second data lines 171a and 171b, a plurality of first and second drain electrodes 175c and 175d, and first and second electrode members 177a and 177b are formed on the ohmic contacts and the gate insulating layer. The first and second data lines 171a and 171b include a plurality of first and second source electrodes 173a and 173b and end portions 179a and 179b. A passivation layer (not shown) is formed on the data conductors 171a, 171b, 175c, and 175d and the exposed portions of the semiconductors 154a and 154b, and the passivation layer and the gate insulating layer have a plurality of contact holes 181, 182a, 182b, 185a, and 185b. A plurality of pixel electrodes 191, including first and second sub-pixel electrodes 191a and 191b, and a plurality of contact assistants 81, 82a, and 82b are formed on the passivation layer. An alignment layer (not shown) is formed on the pixel electrodes 191, the contact assistants 81, 82a, and 82b, and the passivation layer.

In the first pixel PX1 of FIG. 14, like the second pixel PX2 of FIG. 12 and FIG. 13, the passivation layer 180 is removed where the storage electrode 137 and the electrode members 177a and 177b overlap, so that the voltage storing capacity of the storage capacitor may be improved.

In the second pixel PX2 of FIG. 12 and FIG. 13 and the first pixel PX1 of FIG. 14, like the second pixel PX2 of FIG. 6, FIG. 7, FIG. 8, FIG. 9, and FIG. 10 and the first pixel PX1 of FIG. 1, the first and second drain electrodes 175a and 175b have substantially the same shape. Therefore, even though the connecting structures of the first pixel PX1 and the second pixel PX2 are different from each other, the optical and electrical parameters of the two pixels PX1 and PX2 may be adjusted to be the same.

Now, an LCD according to another exemplary embodiment of the present invention will be described in detail with reference to FIG. 15 and FIG. 16.

Figure 15:
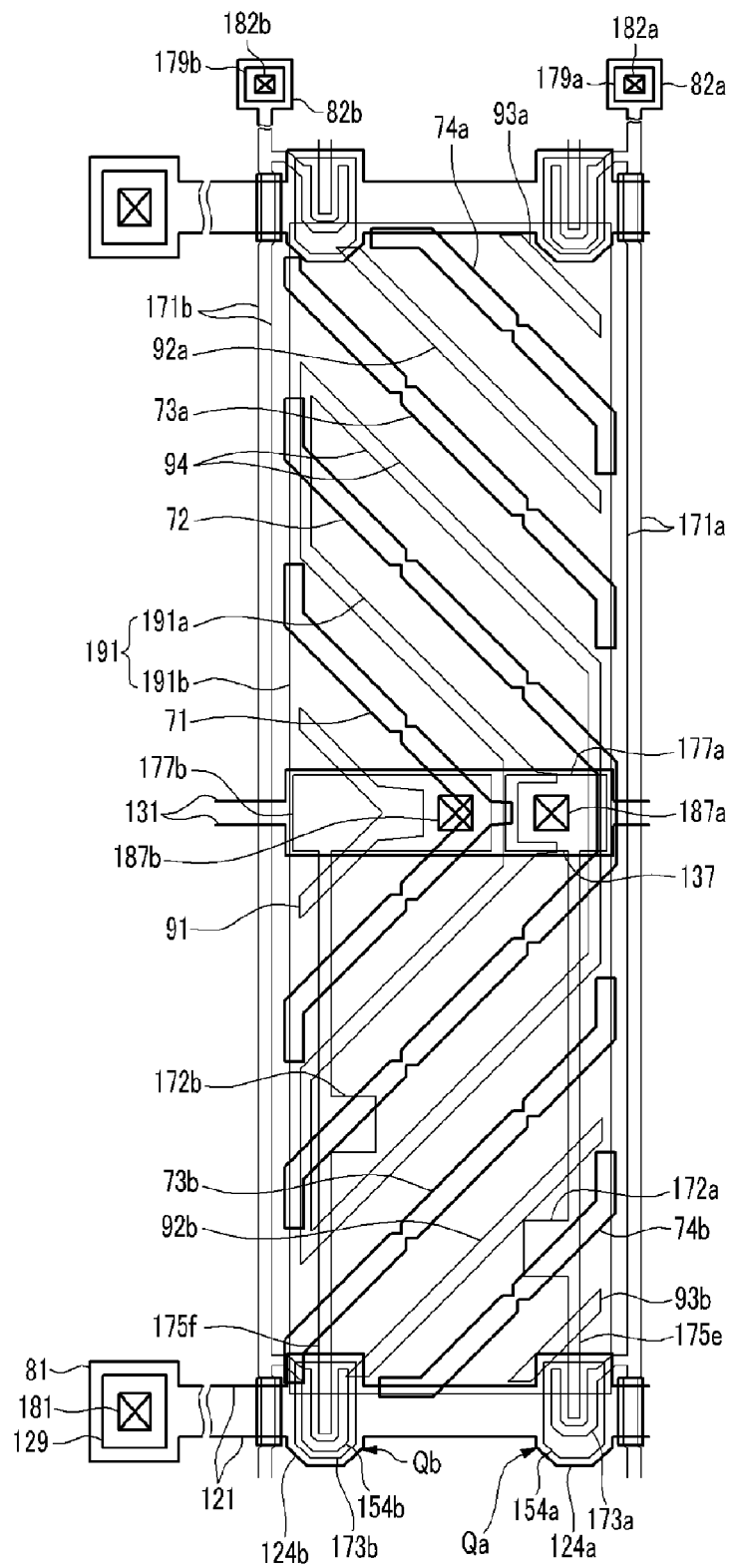
FIG. 15 is a layout view of another example of a pixel of an LCD according to another exemplary embodiment of the present invention.
Figure 16:
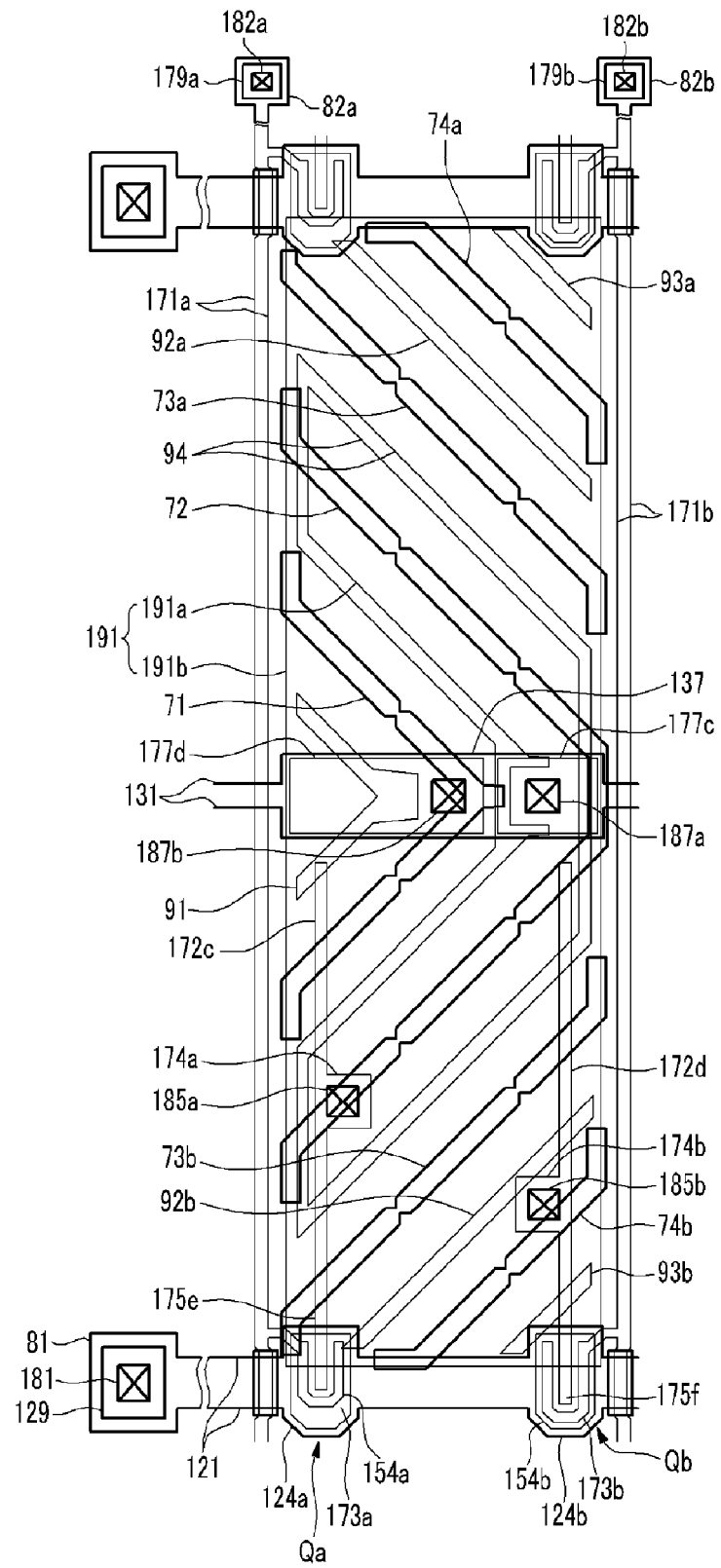
FIG. 16 is a layout view of another example of a pixel of an LCD according to another exemplary embodiment of the present invention.

FIG. 15 is a layout view of a second pixel PX2 of an LCD according to another exemplary embodiment of the present invention, and FIG. 16 is a layout view of a first pixel PX1 of an LCD according to another exemplary embodiment of the present invention.

Referring to FIG. 15, the second pixel PX2 of an LCD according to an exemplary embodiment of the present invention includes a lower panel (not shown) and an upper panel (not shown) opposing each other and an LC layer (not shown) interposed between the two panels.

The layered structure of the LC panel assembly according to the present exemplary embodiment is mostly similar to the layered structure of the LC panel assembly illustrated in FIG. 6, FIG. 7, FIG. 8, FIG. 9, and FIG. 10.

Regarding the lower panel, a plurality of gate conductors including a plurality of gate lines 121 and a plurality of storage electrode lines 131 are formed on an insulating substrate (not shown). Each of the gate lines 121 includes gate electrodes 124a and 124b and an end portion 129, and each of the storage electrode lines 131 includes storage electrodes 137. A gate insulating layer (not shown) is formed on the gate conductors 121 and 131. First and second semiconductor islands 154a and 154b are formed on the gate insulating layer, and a plurality of ohmic contacts (not shown) are formed thereon. Data conductors including a plurality of first and second data lines 171a and 171b, and a plurality of first and second drain electrodes 175e and 175f are formed on the ohmic contacts and the gate insulating layer. The first and second data lines 171a and 171b include a plurality of first and second source electrodes 173a and 173b and end portions 179a and 179b. A passivation layer (not shown) is formed on the data conductors 171a, 171b, 175e, and 175f and the exposed portions of the semiconductors 154a and 154b, and the passivation layer and the gate insulating layer have a plurality of contact holes 181, 182a, 182b, 187a, and 187b. A plurality of pixel electrodes, including first and second sub-pixel electrodes 191a and 191b, and a plurality of contact assistants 81, 82a, and 82b are formed on the passivation layer. An alignment layer (not shown) is formed on the pixel electrodes 191, the contact assistants 81, 82a, and 82b, and the passivation layer.

The description of the upper panel is the same as the above description of FIG. 6, FIG. 7, FIG. 8, FIG. 9, and FIG. 10, and so a detailed description thereof will be omitted.

In the LCD of FIG. 15, unlike FIG. 8, the first and second drain electrodes 175e and 175f include a stem line, a projection 172a and 172b disposed where the stem line overlaps the second and first sub-pixel electrodes 191b and 191a, and an expansion 177a and 177b overlapping the storage electrodes 137. Contact holes 187a and 187b are formed in the passivation layer where the storage electrodes 137 and the expansions 177a and 177b of the first and second drain electrodes 175e and 175f overlap, so that the first and second drain electrodes 175e and 175f are connected to the first and second sub-pixel electrodes 191a and 191b.

Now, a first pixel PX1 of an LCD according to another exemplary embodiment of the present invention will be described in detail with reference to FIG. 16.

Referring to FIG. 16, a first pixel PX1 of an LCD according to an exemplary embodiment of the present invention includes a lower panel (not shown) and an upper panel (not shown) opposing each other and an LC layer (not shown) interposed between the two panels.

The layered structure of the LC panel assembly according to the present exemplary embodiment is mostly similar to the layered structure of the LC panel assembly illustrated in FIG. 6, FIG. 7, FIG. 8, FIG. 9, and FIG. 10.

Regarding the lower panel, a plurality of gate conductors including a plurality of gate lines 121 and a plurality of storage electrode lines 131 are formed on an insulating substrate (not shown). Each of the gate lines 121 includes gate electrodes 124a and 124b and an end portion 129, and each of the storage electrode lines 131 includes storage electrodes 137. A gate insulating layer (not shown) is formed on the gate conductors 121 and 131. First and second semiconductor islands 154a and 154b are formed on the gate insulating layer, and a plurality of ohmic contacts (not shown) are formed thereon. Data conductors including a plurality of first and second data lines 171a and 171b, a plurality of first and second drain electrodes 175e and 175f, and data conductor pieces 177c and 177d are formed on the ohmic contacts and the gate insulating layer. The first and the second data lines 171a and 171b include a plurality of first and second source electrodes 173a and 173b and end portions 179a and 179b. A passivation layer (not shown) is formed on the data conductors 171a, 171b, 175e, and 175f and the exposed portions of the semiconductors 154a and 154b, and the passivation layer and the gate insulating layer have a plurality of contact holes 181, 182a, 182b, 185a, 185b, 187a, and 187b. A plurality of pixel electrodes 191, including first and second sub-pixel electrodes 191a and 191b, and a plurality of contact assistants 81, 82a, and 82b are formed on the passivation layer. An alignment layer (not shown) is formed on the pixel electrodes 191, the contact assistants 81, 82a, and 82b, and the passivation layer.

The description of the upper panel is the same as the above description of FIG. 6, FIG. 7, FIG. 8, FIG. 9, and FIG. 10, and so a detailed description thereof will be omitted.

In the first pixel PX1 of FIG. 16, unlike the second pixel PX2 of FIG. 15, the first data line 171a is disposed on the left side of the pixel electrode 191 and the second data line 171b is disposed on the right side of the pixel electrode 191. That is, the first switching element Qa, which consists of the first semiconductor 154a, the first source electrode 173a, and the first drain electrode 175e, is disposed on the left side of the pixel electrode 191, and the second switching element Qb, which consists of the second semiconductor 154b, the second source electrode 173b, and the second drain electrode 175f, is disposed on the right side of the pixel electrode 191.

Also, the first and second drain electrodes 175e and 175f include a stem line 172c and 172d and a projection 174a and 174b. At the projection 174a and 174b, the first and second drain electrodes 175e and 175f are connected to the first and second sub-pixel electrodes 191a and 191b through the contact holes 185a and 185b.

Meanwhile, data conductor pieces 177c and 177d, separated from the first and second drain electrodes 175e and 175f, overlap the storage electrode 137. The data conductor pieces 177c and 177d are connected to the first and second sub-pixel electrodes 191a and 191b through the contact holes 187a and 187b and increase the capacitance of the storage capacitor.

The shapes of the drain electrodes 175e and 175f including the projections 172a and 172b in the second pixel PX2 of FIG. 15 are similar to the planar shapes of the drain electrodes 175e and 175f including the projections 174a and 174b in the first pixel PX1 of FIG. 16. Consequently, the optical characteristics of the two pixels PX1 and PX2 may be kept uniform.

According to the present invention, there may be minimal or no degradation of image quality when a column inversion drive is performed and all pixels may have uniform optical characteristics.

It will be apparent to those skilled in the art that various modifications and variations can be made in the present invention without departing from the spirit or scope of the invention. Thus, it is intended that the present invention cover the modifications and variations of this invention provided they come within the scope of the appended claims and their equivalents.

What is claimed is:

1. A liquid crystal display, comprising:
first pixels and second pixels;
a plurality of gate lines to transmit gate signals; and
a plurality of pairs of first data lines and second data lines crossing the gate lines, the pairs of first data lines and second data lines facing each other with the first pixels and the second pixels interposed therebetween,
wherein each of the first pixels and second pixels comprises:
a plurality of pixel electrodes comprising a plurality of pairs of first sub-pixel electrodes and second sub-pixel electrodes, and a plurality of pairs of first drain electrodes and second drain electrodes,
wherein the first drain electrodes are disposed on the right of the first data lines, and the second drain electrodes are disposed on the left of the second data lines,
wherein the first drain electrodes are connected to the first sub-pixel electrodes while the second drain electrodes are connected to the second sub-pixel electrodes in the first pixels, and the first drain electrodes are connected to the second sub-pixel electrodes while the second drain electrodes are connected to the first sub-pixel electrodes in the second pixels, and
wherein a first part composed of the first and second drain electrodes of the first pixels has substantially a same shape as a second part composed of the first and second drain electrodes of the second pixels.

2. The liquid crystal display of claim 1, wherein each of the first drain electrodes and the second drain electrodes comprises at least one dummy portion.

3. The liquid crystal display of claim 2, wherein each of the first drain electrodes and the second drain electrodes of the first pixels or the second pixels comprises a contact portion connected to the pixel electrode of the first pixels or the second pixels, the dummy portion comprises at least one first branch that extends from the contact portion.

4. The liquid crystal display of claim 3, wherein the dummy portion comprises at least one second branch that is positioned between the drain electrodes and the contact portion.

5. The liquid crystal display of claim 1, wherein a first data voltage applied to the first data lines is different from a second data voltage applied to the second data lines.

6. The liquid crystal display of claim 1, wherein a polarity of a voltage of the first data lines is opposite to a polarity of a voltage of the second data lines.

7. The liquid crystal display of claim 1, wherein the first pixels and the second pixels are alternately disposed in a column direction.

8. The liquid crystal display of claim 1, wherein first units and second units are alternately disposed in a column direction, the first unit comprising at least two of the first pixels arranged successively in the column direction and the second unit comprising at least two of the second pixels arranged successively in the column direction.

9. The liquid crystal display of claim 1, wherein the first pixels or the second pixels are repeatedly arranged in a row.

10. The liquid crystal display of claim 1, wherein a polarity of a voltage of the first sub-pixel electrodes is opposite to a polarity of a voltage of the second sub-pixel electrodes in the first pixels and a polarity of a voltage of the first sub-pixel electrodes is opposite to a polarity of a voltage of the second sub-pixel electrodes in the second pixels.

11. The liquid crystal display of claim 1, wherein polarities of voltages of the first sub-pixel electrodes adjacent to each other in a column direction change every one or more rows.

12. The liquid crystal display of claim 1, wherein polarities of voltages of the first sub-pixel electrodes adjacent to each other in a row direction are opposite each other.

13. The liquid crystal display of claim 1, wherein polarities of voltages of the second sub-pixel electrodes adjacent to each other in a column direction change every one or more rows.

14. The liquid crystal display of claim 1, wherein polarities of voltages of the second sub-pixel electrodes adjacent to each other in a row direction are opposite to each other.

15. The liquid crystal display of claim 1, wherein the first sub-pixel electrodes of the first pixels or the second pixels have different areas from the second sub-pixel electrodes of the first pixels or the second pixels.

16. The liquid crystal display of claim 15, wherein the first sub-pixel electrodes of the first pixels or the second pixels have smaller areas than the second sub-pixel electrodes of the first pixels or the second pixels.

17. The liquid crystal display of claim 1, wherein the first sub-pixel electrodes of the first pixels or the second pixels have different voltages from the second sub-pixel electrodes of the first pixels or the second pixels.

18. The liquid crystal display of claim 17, wherein the first sub-pixel electrodes of the first pixels or the second pixels have greater voltages than the voltage of the second sub-pixel electrodes of the first pixels or the second pixels.

19. The liquid crystal display of claim 1, wherein at least one of the first sub-pixel electrodes and the second sub-pixel electrodes of the first pixels or the second pixels comprises a tilt direction determining member.

20. The liquid crystal display of claim 19, wherein the tilt direction determining member comprises a cutout.

21. The liquid crystal display of claim 1, further comprising a common electrode facing the first sub-pixel electrodes and the second sub-pixel electrodes of the first pixels or the second pixels,
wherein the common electrode comprises a tilt direction determining member.

22. The liquid crystal display of claim 21, wherein the tilt direction determining member comprises a cutout or a protrusion.

23. The liquid crystal display of claim 1, further comprising a storage electrode overlapping each pixel electrode.

24. The liquid crystal display of claim 23, wherein the first drain electrodes and the second drain electrodes of the first pixels or the second pixels overlap the storage electrode, respectively.

25. The liquid crystal display of claim 23, further comprising a data conductor piece overlapping the storage electrode.

26. The liquid crystal display of claim 1, wherein the drain electrodes of the first pixels substantially have a same area as the drain electrodes of the second pixels.

27. The liquid crystal display of claim 1, wherein the drain electrodes of the first pixels substantially have a same length as the drain electrodes of the second pixels.

28. The liquid crystal display of claim 1, wherein each of the first drain electrodes and the second drain electrodes comprises at least one stem line and at least one projection.

29. The liquid crystal display of claim 28, wherein the first drain electrodes and the second drain electrodes of the second pixels are connected respectively to the first and second sub-pixel electrodes through contact holes, wherein the contact holes are formed in a storage electrode.

30. The liquid crystal display of claim 29, wherein the first drain electrodes and the second drain electrodes of the second pixels have an expansion overlapping the storage electrode.

31. The liquid crystal display of claim 28, wherein the first drain electrodes and the second drain electrodes of the first pixels are connected respectively to the first and second sub-pixel electrodes through contact holes, wherein each of the contact holes is formed in a projection.

32. The liquid crystal display of claim 31, wherein each of the first pixels has data conductor pieces separated from the first drain electrodes and second drain electrodes and wherein the data conductor pieces overlap a storage electrode.

33. The liquid crystal display of claim 32, wherein the data conductor pieces are connected to the first and second sub-pixel electrodes through the contact holes.

* * * * *